(12) United States Patent
Masunaga et al.

(10) Patent No.: US 9,379,040 B2
(45) Date of Patent: Jun. 28, 2016

(54) SEMICONDUCTOR DEVICE AND METHOD OF MANUFACTURING SEMICONDUCTOR DEVICE

(71) Applicant: KABUSHIKI KAISHA TOSHIBA, Minato-ku (JP)

(72) Inventors: Takayuki Masunaga, Yokkaichi (JP); Kazuhiro Ueda, Aisai (JP); Naotake Watanabe, Mie (JP); Koji Maruno, Yokkaichi (JP); Toshihiko Kida, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/627,598

(22) Filed: Feb. 20, 2015

(65) Prior Publication Data
US 2015/0279763 A1    Oct. 1, 2015

(30) Foreign Application Priority Data

Mar. 31, 2014    (JP) .................................. 2014-071325

(51) Int. Cl.
| | | |
|---|---|---|
| *H01L 23/52* | (2006.01) | |
| *H01L 23/473* | (2006.01) | |
| *H01L 21/54* | (2006.01) | |
| *H01L 21/56* | (2006.01) | |

(Continued)

(52) U.S. Cl.
CPC .............. *H01L 23/473* (2013.01); *H01L 21/54* (2013.01); *H01L 21/565* (2013.01); *H01L 23/28* (2013.01); *H01L 23/3107* (2013.01); *H01L 23/3135* (2013.01); *H01L 23/3736* (2013.01); *H01L 23/42* (2013.01); *H01L 23/4334* (2013.01); *H01L 23/49562* (2013.01); *H01L 25/065* (2013.01); *H01L 23/051* (2013.01); *H01L 2924/181* (2013.01)

(58) Field of Classification Search
CPC ........ H01L 21/54; H01L 21/56; H01L 23/051
See application file for complete search history.

(56) References Cited

U.S. PATENT DOCUMENTS

| | | |
|---|---|---|
| 6,703,707 B1 | 3/2004 | Mamitsu et al. |
| 2004/0070060 A1 | 4/2004 | Mamitsu et al. |

(Continued)

FOREIGN PATENT DOCUMENTS

| | | |
|---|---|---|
| JP | 2003-258166 A | 9/2003 |
| JP | 2007-068302 A | 3/2007 |
| WO | 2012/132709 A1 | 10/2012 |

OTHER PUBLICATIONS

Extended Search Report issued Sep. 30, 2015 in European Patent Application No. 15156278.2.

(Continued)

*Primary Examiner* — Daniel Whalen
(74) *Attorney, Agent, or Firm* — Oblon, McClelland, Maier & Neustadt, L.L.P.

(57) ABSTRACT

According to one embodiment, a semiconductor device includes a first conductor, a second conductor, and an envelope. The first conductor includes a first radiation surface. The second conductor includes a second radiation surface. The envelope includes a first envelope portion which is composed of a first insulative material and is formed such that the first envelope portion seals a semiconductor, and a second envelope portion which is composed of a second insulative material and is formed in contact with the first radiation surface and the second radiation surface.

3 Claims, 10 Drawing Sheets

(51) Int. Cl.
*H01L 23/28* (2006.01)
*H01L 23/42* (2006.01)
*H01L 23/31* (2006.01)
*H01L 23/373* (2006.01)
*H01L 23/433* (2006.01)
*H01L 23/495* (2006.01)
*H01L 25/065* (2006.01)
*H01L 23/051* (2006.01)

(56) References Cited

U.S. PATENT DOCUMENTS

| | | |
|---|---|---|
| 2004/0070072 A1 | 4/2004 | Mamitsu et al. |
| 2004/0089925 A1 | 5/2004 | Fukuda et al. |
| 2004/0089940 A1 | 5/2004 | Mamitsu et al. |
| 2004/0089941 A1 | 5/2004 | Mamitsu et al. |
| 2004/0089942 A1 | 5/2004 | Mamitsu et al. |
| 2004/0097082 A1 | 5/2004 | Mamitsu et al. |
| 2005/0167821 A1 | 8/2005 | Mamitsu et al. |
| 2007/0096278 A1* | 5/2007 | Nakatsu ............... H01L 25/071 257/678 |
| 2007/0216013 A1 | 9/2007 | Funakoshi et al. |
| 2011/0037166 A1 | 2/2011 | Ikeda et al. |
| 2013/0181228 A1* | 7/2013 | Usui ............... H01L 23/4334 257/77 |
| 2013/0267064 A1 | 10/2013 | Ikeda et al. |
| 2013/0285229 A1* | 10/2013 | Stella ............... H01L 23/4334 257/692 |
| 2014/0117526 A1* | 5/2014 | Nishiuchi ............ H01L 23/473 257/693 |
| 2014/0124909 A1 | 5/2014 | Masunaga et al. |

OTHER PUBLICATIONS

Qizhen Liang, et al., "Thermal Conductivity Enhancement of Epoxy Composites by Interfacial Covalent Bonding for Underfill and Thermal Interfacial Materials in Cu/Low-K Application", IEEE Transactions on Components, Packaging and Manufacturing Technology, vol. 2, No. 10, Oct. 2012, XP011465924, pp. 1571-1579.

* cited by examiner

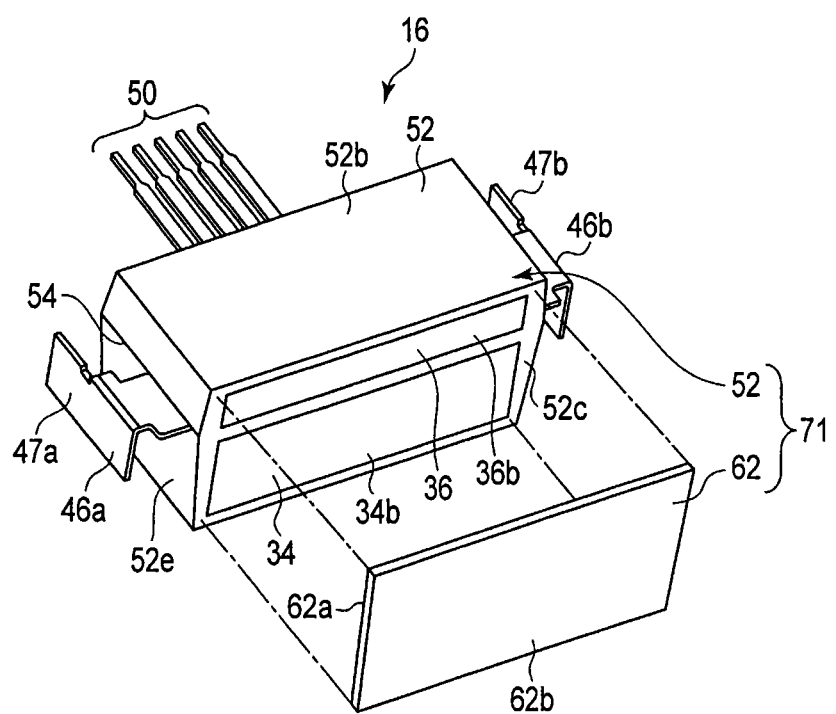
F I G. 4

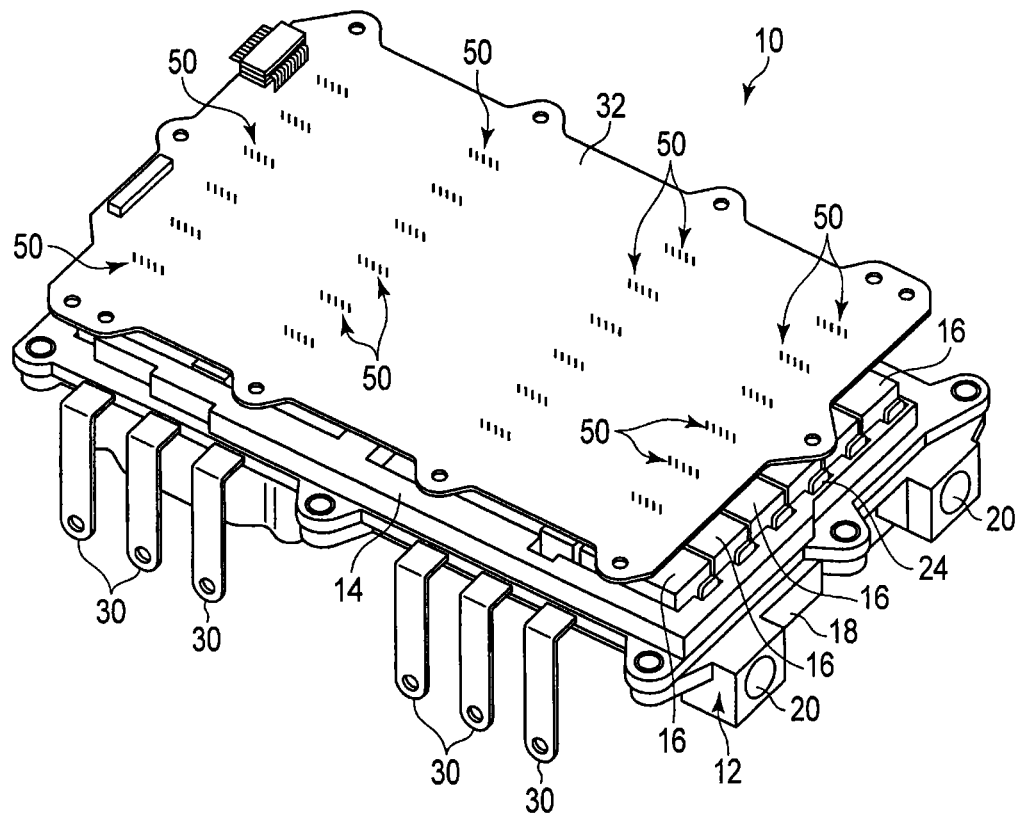
F I G. 7

US 9,379,040 B2

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2014-071325, filed Mar. 31, 2014, the entire contents of which are incorporated herein by reference.

FIELD

Embodiments described herein relate generally to a semiconductor device and a method of manufacturing the semiconductor device.

BACKGROUND

In recent years, in order to improve the fuel consumption of automobiles, hybrid cars, in which internal combustion engines and motors are used in combination, have been quickly gaining in popularity. On the other hand, the commercialization of electric cars, which can run by motors alone, has been progressing. In order to realize these vehicles, a power converter for converting DC power to AC power and converting AC power to DC power needs to be provided between a battery and a motor.

In the field of hybrid cars and electric cars, there is a demand for reduction in size and high reliability of semiconductor power converters. In order to realize the reduction in size and high reliability of the semiconductor power converter, a semiconductor power converter with high cooling efficiency is needed. As a method for realizing this, there has been proposed a double-surface radiation type semiconductor device in which conductors are connected to front and back surfaces of a semiconductor element and heat is dissipated to a radiator from the conductors.

BRIEF DESCRIPTION OF THE DRAWINGS

FIG. 4 is an exploded perspective view illustrating an example of the semiconductor device of the embodiment, as viewed from a bottom surface side.

FIG. 7 is a perspective view illustrating an example of the entirety of the semiconductor power converter including the control circuit board.

DETAILED DESCRIPTION

In general, according to one embodiment, a semiconductor device includes a semiconductor element, a first conductor, a second conductor, and an envelope. The semiconductor element includes a first electrode, and a second electrode formed on a surface opposed to the first electrode. The first conductor includes a first coupling surface which is electrically connected to the first electrode, and a first radiation surface. The second conductor includes a second coupling surface which is electrically connected to the second electrode, and a second radiation surface. The envelope includes a first envelope portion which is composed of a first insulative material and is formed such that the first envelope portion seals the semiconductor element, and a second envelope portion which is composed of a second insulative material having a higher coefficient of thermal conductivity than the first insulative material and is formed in contact with the first radiation surface and the second radiation surface.

A semiconductor power converter according to an embodiment will now be described in detail with reference to the accompanying drawings. Incidentally, the respective drawings are schematic views for illustrating the embodiment and making easier the understanding thereof. Although shapes, dimensions, ratios, etc. are different from those of the actual apparatus in some parts, these can properly be altered in design in consideration of the description below and the prior art.

Figure 1:
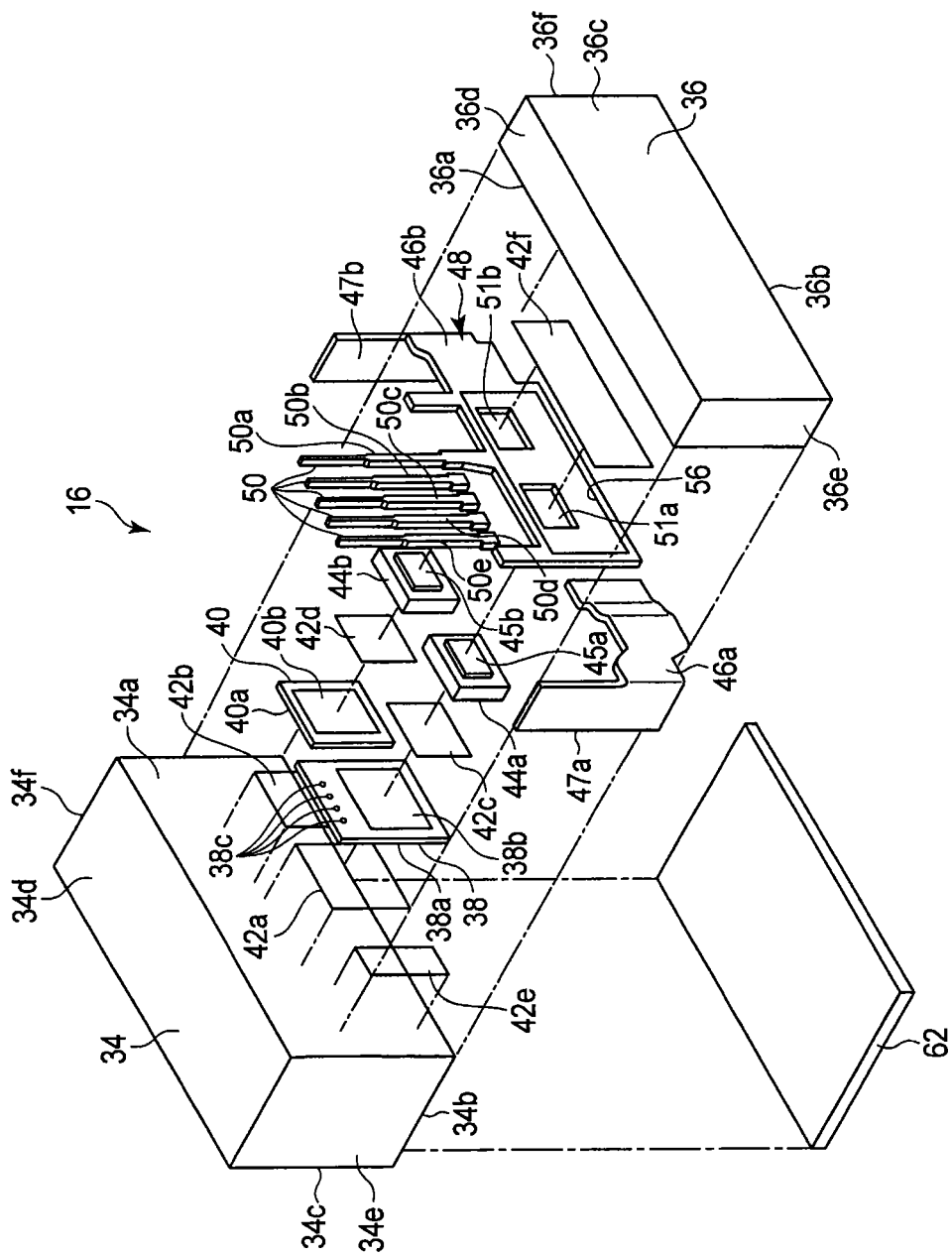
FIG. 1 is an exploded perspective view for describing an example of structural members of a semiconductor device of an embodiment.

FIG. 1 is an exploded perspective view for describing an example of structural members of a semiconductor device 16 of an embodiment. The semiconductor device 16 of the embodiment is constructed as a power converter of a so-called both-surface radiation type and vertical mount type.

The semiconductor device 16 includes a first conductor 34, a second conductor 36, a first semiconductor element 38, a second semiconductor element 40, a first convex conductor 44a, a second convex conductor 44b, a first power terminal 46a, a connection member 48, and a plurality of coupling members 42a to 42f.

The first conductor 34 is formed, for example, of copper in a substantially rectangular parallelepipedic shape. The first conductor 34 includes a planar, rectangular first coupling surface 34a, and a planar, rectangular first radiation surface 34b which is perpendicular to the first coupling surface 34a. Further, the first conductor 34 includes a planar, rectangular surface 34c which is opposed to the first coupling surface 34a; a planar, rectangular surface 34d which is opposed to the first radiation surface 34b and is perpendicular to the first coupling surface 34a; a planar, rectangular surface 34e which is perpendicular to the first coupling surface 34a and first radiation surface 34b; and a planar, rectangular surface 34f which is opposed to the surface 34e and is perpendicular to the first coupling surface 34a and first radiation surface 34b. Incidentally, it should suffice if the first conductor 34 includes the first coupling surface 34a, and the first radiation surface 34b which is perpendicular to the first coupling surface 34a, and the first conductor 34 may have a shape other than the substantially rectangular parallelepipedic shape. The first coupling surface 34a may have a shape other than the rectangular shape. The first radiation surface 34b may have a shape other than the rectangular shape.

The second conductor 36 is formed, for example, of copper in a substantially rectangular parallelepipedic shape. The second conductor 36 includes a planar, rectangular second coupling surface 36a, and a planar, rectangular second radiation surface 36b which is perpendicular to the second coupling surface 36a. Further, the second conductor 36 includes a planar, rectangular surface 36c which is opposed to the second coupling surface 36a; a planar, rectangular surface 36d which is opposed to the second radiation surface 36b and is perpendicular to the second coupling surface 36a; a planar, rectangular surface 36e which is perpendicular to the second coupling surface 36a and second radiation surface 36b; and a planar, rectangular surface 36f which is opposed to the surface 36e and is perpendicular to the second coupling surface 36a and second radiation surface 36b. The second coupling surface 36a is opposed to the first coupling surface 34a. The second radiation surface 36b is located on an imaginary plane including the first radiation surface 34b. This aims at making a distance from the first radiation surface 34b to a heat-receiving surface 18a (shown in FIG. 6 to be described later) substantially equal to a distance from the second radiation surface 36b to the heat-receiving surface 18a, when the semiconductor device 16 is disposed on the heat-receiving surface 18a. The heat radiation properties of the first conductor 34 and second conductor 36 depend on the distances (shortest radiation paths) from the first radiation surface 34b and second radiation surface 36b to the heat-receiving surface 18a. If the distance from the first radiation surface 34b to the heat-receiving surface 18a and the distance from the second radiation surface 36b to the heat-receiving surface 18a are short, the radiation property of each of the first conductor 34 and second conductor 36 is improved. If the distance from the first radiation surface 34b to the heat-receiving surface 18a is substantially equal to the distance from the second radiation surface 36b to the heat-receiving surface 18a, the radiation property of neither of the conductors is sacrificed. In other words, if the distance from the first radiation surface 34b to the heat-receiving surface 18a is different from the distance from the second radiation surface 36b to the heat-receiving surface 18a, the radiation property of the conductor, which has a larger distance to the heat-receiving surface 18a, becomes poorer than the radiation property of the conductor, which has a smaller distance to the heat-receiving surface 18a.

Incidentally, it should suffice if the second conductor 36 includes the second coupling surface 36a, and the second radiation surface 36b which is located on the imaginary plane including the first radiation surface 34b and is perpendicular to the second coupling surface 36a, and the second conductor 36 may have a shape other than the substantially rectangular parallelepipedic shape. The second coupling surface 36a may have a shape other than the rectangular shape. The second radiation surface 36b may have a shape other than the rectangular shape.

The first semiconductor element 38 is a power semiconductor element, for example, an IGBT (insulated gate bipolar transistor). The first semiconductor element 38 is interposed between the first conductor 34 and second conductor 36, and is coupled to these conductors. The first semiconductor element 38 includes an electrode 38a and an electrode 38b. The first semiconductor element 38 is formed in a rectangular plate shape, and includes the electrode 38a on a first surface thereof, and the electrode 38b, which is different from the electrode 38a, on a second surface thereof which is opposed to the first surface. Incidentally, it should suffice if the first semiconductor element 38 includes the electrode 38a and electrode 38b, and the first semiconductor element 38 may have a shape other than the rectangular plate shape. A plurality of connection terminals 38c, for example, four connection terminals 38c, are formed on the second surface of the first semiconductor element 38. In addition, the first surface and second surface of the first semiconductor element 38, excluding the electrode part and connection terminal part, are covered with an insulation film, for example, a film of a polyimide.

The first semiconductor element 38 is disposed in parallel to the coupling surface 34a of the first conductor 34, and the electrode 38a (collector) is coupled to the first coupling surface 34a of the first conductor 34 by a first connection member, for example, a rectangular solder sheet 42a.

The second semiconductor element 40 is interposed between the first conductor 34 and second conductor 36, and is coupled to the first conductor 34 and second conductor 36. The second semiconductor element 40 includes a diode. The second semiconductor element 40 includes an electrode 40a and an electrode 40b. The second semiconductor element 40 is formed in a rectangular plate shape, and includes the electrode 40a on a first surface thereof, and the electrode 40b, which is different from the electrode 40a, on a second surface thereof which is opposed to the first surface. Incidentally, it should suffice if the second semiconductor element 40 includes the electrode 40a and electrode 40b, and the second semiconductor element 40 may have a shape other than the rectangular plate shape. The first surface and second surface of the second semiconductor element 40, excluding rectangular electrode parts, are covered with an insulation film, for example, a film of a polyimide.

The second semiconductor element 40 is disposed in parallel to the coupling surface 34a of the first conductor 34, and is juxtaposed with the first semiconductor element 38 with a gap. The electrode 40a of the second semiconductor element 40 is coupled to the first coupling surface 34a of the first conductor 34 by a second connection member, for example, a rectangular solder sheet 42b.

The first convex conductor 44a is coupled onto the electrode 38b of the first semiconductor element 38 by a third connection member, for example, a rectangular solder sheet 42c.

The first convex conductor 44a is formed of, for example, copper, and includes, as one body, a flat, rectangular parallelepipedic main body, and a flat, rectangular parallelepipedic projection portion 45a which has smaller dimensions than the main body and projects from one major surface of the main body toward the coupling surface 36a side of the second conductor 36. The planar major surface of the main body of the first convex conductor 44a is electrically and mechanically coupled to the electrode 38b of the first semiconductor element 38 by a solder sheet 42c. Incidentally, it should suffice if the first convex conductor 44a has such a shape that the first convex conductor 44a can be electrically and mechanically coupled to the electrode 38b of the first semiconductor element 38, and the shape thereof is not limited to the above-described shape.

The second convex conductor 44b is coupled onto the other electrode of the second semiconductor element 40 by a fourth connection member, for example, a rectangular solder sheet 42d. The second convex conductor 44b is formed of, for example, copper, and includes, as one body, a flat, rectangular parallelepipedic main body, and a flat, rectangular parallelepipedic projection portion 45b which has smaller dimensions than the main body and projects from one major surface of the main body toward the coupling surface 36a side of the second conductor 36. In addition, the planar major surface of the main body of the second convex conductor 44b is electrically and mechanically coupled to the electrode 40b of the second semiconductor element 40 by a solder sheet 42d. Incidentally, it should suffice if the second convex conductor 44b has such a shape that the second convex conductor 44b can be electrically and mechanically coupled to the electrode 40b of the second semiconductor element 40, and the shape thereof is not limited to the above-described shape.

In the meantime, the first and second convex conductors 44a and 44b may not be separately formed, and the two main bodies thereof may be formed as one body, and the two projection portions may be provided on a common main body.

The first power terminal 46a is independently formed, and a proximal end portion thereof is coupled to the coupling surface 34a of the first conductor 34 by a fifth connection member, for example, a rectangular solder sheet 42e. The first power terminal 46a extends to such a position that the first power terminal 46a is not opposed to the first conductor 34 or second conductor 36.

A second power terminal 46b has its proximal end portion coupled to the connection member 48. The second power terminal 46b extends to such a position that the second power terminal 46b is not opposed to the first conductor 34 or second conductor 36.

The connection member 48 is formed of an elongated, rectangular conductive metal plate. In this connection member 48, a first opening 51a and a second opening 51b for alignment, which are rectangular, are formed in juxtaposition. The first opening 51a is formed to have such a size that the projection portion 45a of the first convex conductor 44a can be engaged in the first opening 51a, and to be smaller than the main body of the first convex conductor 44a. Similarly, the second opening 51b is formed to have such a size that the projection portion 45b of the second convex conductor 44b can be engaged in the second opening 51b, and to be smaller than the main body of the second convex conductor 44b. In a surface of the connection member 48 on the second conductor 36 side, a shallow, rectangular recess 56 is formed over an area including the first and second openings 51a, 51b. Further, the connection member 48 integrally includes three support projections which project upward from its upper edge. One signal terminal 50 extends upward from the middle support projection. Specifically, an emitter branch terminal 50a of five signal terminals 50 extends such that the emitter branch terminal 50a is branched from the connection member 48, and is located substantially parallel to the other signal terminals 50.

The connection member 48 and second power terminal 46b are coupled to the first and second convex conductors 44a and 44b in the state in which the projection portions 45a and 45b of the first and second convex conductors 44a and 44b are engaged in the first opening 51a and second opening 51b, respectively.

In addition, the connection member 48 and the projection portions 45a and 45b of the first and second convex conductors 44a and 44b are electrically and mechanically coupled to the coupling surface 36a of the second conductor 36 by a sixth connection member disposed in the recess 56 of the connection member 48, for example, a rectangular solder sheet 42f. Specifically, the three members, namely the connection member 48, the first, second convex conductor 44a, 44b and the second conductor 34, are mutually coupled by the solder sheet 42f.

By the above, the first semiconductor element 38 and second semiconductor element 40 are interposed and disposed between the first conductor 34 and second conductor 36. The first electrode 38a of the first semiconductor element 38 is electrically connected to the first coupling surface 34a of the first conductor 34, and the second electrode 38b of the first semiconductor element 38 is electrically connected to the second coupling surface 36a of the second conductor 36. Similarly, the first electrode 40a of the second semiconductor element 40 is electrically connected to the first coupling surface 34a of the first conductor 34, and the second electrode 40b of the second semiconductor element 40 is electrically connected to the second coupling surface 36a of the second conductor 36. For example, the first semiconductor element 38 and second semiconductor element 40 are disposed to be parallel to the first coupling surface 34a and second coupling surface 36a, and to be perpendicular to the first radiation surface 34b and second radiation surface 36b.

The signal terminals 50 extend in parallel to the coupling surface 34a of the first conductor 34. Proximal ends of four of the signal terminals 50 are connected to the connection terminals 38c of the first semiconductor element 38 by bonding wires (not shown). The semiconductor device 16 of this embodiment includes, for example, five signal terminals 50. The signal terminals 50 are formed in elongated rod shapes, and extend in parallel to each other. Incidentally, the number of terminals, which constitute the signal terminals 50, may be other than five.

Figure 2:
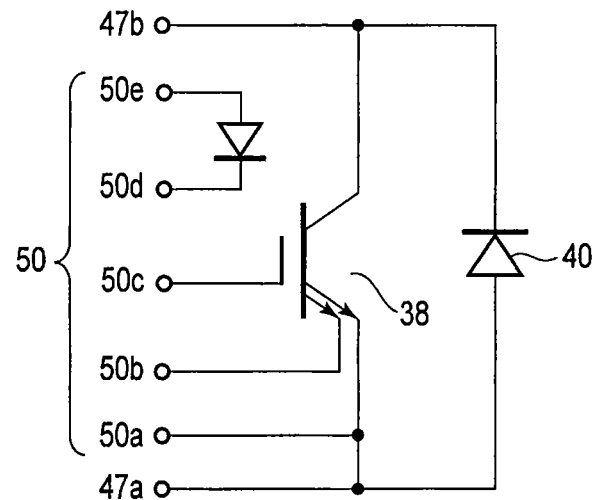
FIG. 2 is a view illustrating an example of an equivalent circuit of the semiconductor device of the embodiment.

FIG. 2 is a view illustrating an example of an equivalent circuit of the semiconductor device 16 of the embodiment.

The signal terminals 50 include the above-described emitter branch terminal (collector-emitter voltage monitor terminal) (branch signal terminal) 50a which is branched from the connection member 48, that is, which is continuous with the connection member 48; a current (emitter sense current) monitor terminal 50b; a gate (gate-emitter voltage) terminal 50c; and chip temperature monitor terminals 50d and 50e. The proximal ends of the signal terminals 50b, 50c, 50d and 50e are connected to the corresponding connection terminals 38c of the first semiconductor elements 38 by bonding wires (lead wires) not shown. The first semiconductor element 38 is connected to the first power terminal 46a and second power terminal 46b via the first conductor 34 and second conductor 36. Similarly, the second semiconductor element 40 is connected to the first power terminal 46a and second power terminal 46b via the first conductor 34 and second conductor 36.

Figure 3:
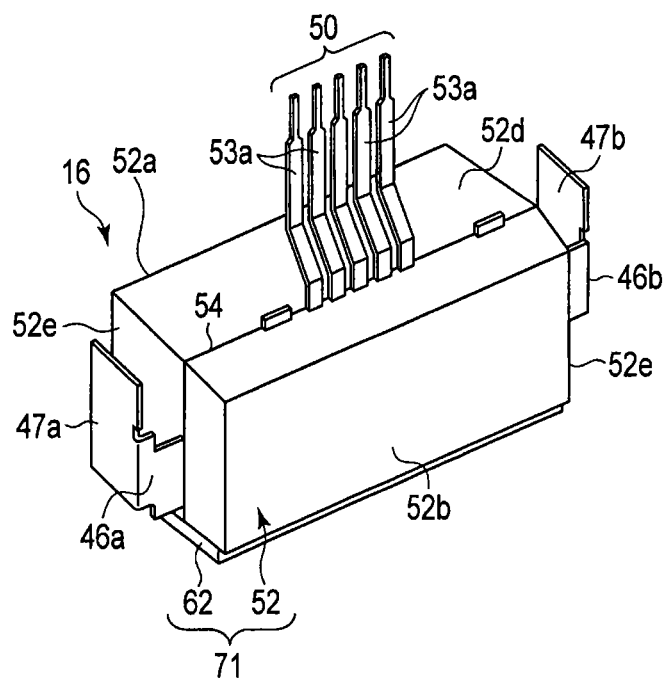
FIG. 3 is a perspective view illustrating an example of the semiconductor device of the embodiment.

FIG. 3 is a perspective view illustrating an example of the semiconductor device 16 of the embodiment. FIG. 4 is a perspective view illustrating an example of the semiconductor device of the embodiment 16, as viewed from a bottom surface side. Incidentally, FIG. 4 shows, in exploded view, a second insulator 62, which is separated from the semiconductor device 16.

The semiconductor device 16 further includes a first insulator 52 and a second insulator 62. In this embodiment, in a direction (hereinafter referred to as first direction) perpendicular to an imaginary plane including the first radiation surface 34b and second radiation surface 36b, an outer surface on the side of the plural signal terminals 50 is referred to as a top surface of the semiconductor device 16, and an outer surface on the side of the second insulator 62 is referred to as a bottom surface of the semiconductor device 16.

The first insulator 52 is an insulation layer which insulates the structural members of the semiconductor device 16. It should suffice if the first insulator 52 is formed of a material with insulation properties, and the material thereof is not limited. The first insulator 52 seals the first semiconductor element 38 and second semiconductor element 40. In addition, the first insulator 52 covers the surfaces (first coupling surface 34a, surface 34c, surface 34d, surface 34e, surface 34f in the example shown in FIG. 1) of the first conductor 34, excluding the first radiation surface 34b of the first conductor 34, and the surfaces (second coupling surface 36a, surface 36c, surface 36d, surface 36e, surface 36f in the example shown in FIG. 1) of the second conductor 36, excluding the second radiation surface 36b of the second conductor 36. Furthermore, the first insulator 52 covers the first convex conductor 44a, second convex conductor 44b, connection member 48, the proximal end portion of the first power terminal 46a, the proximal end portion of the second power terminal 46b, and the proximal end portions of the signal terminals 50).

The first insulator 52 includes two side surfaces 52a and 52b which are parallel to each other, a planar bottom surface 52c which is perpendicular to the side surfaces 52a and 52b, a top surface 52d which is opposed to the bottom surface 52c, two end surfaces 52e, and a parting line 54. As illustrated in FIG. 4, the bottom surface 52c of the first insulator 52 is located on the imaginary plane including the first radiation surface 34b and second radiation surface 36b.

This parting line 54 is located in a plane including the connection member 48 of a lead frame, the first power terminal 46a and the second power terminal 46b, and is left along the top surface 52d and both end surfaces 52e of the first insulator 52. In addition, the parting line 54 is located with a displacement to the side surface 52b side.

That part of the top surface 52d of the first insulator 52, which is located between the parting line 54 and the side surface 52a, extends with a slight inclination to the bottom surface 52c side from the parting line 54 toward the side surface 52a, and that part of the top surface 52d of the first insulator 52, which is located between the parting line 54 and the side surface 52b, extends with a slight inclination to the bottom surface 52c side from the parting line 54 toward the side surface 52b.

That part of each end surface 52e of the first insulator 52, which is located between the parting line 54 and the side surface 52a, extends with a slight inclination to the other end surface 52e side from the parting line 54 toward the side surface 52a, and that part of each end surface 52e of the first insulator 52, which is located between the parting line 54 and the side surface 52b, extends with a slight inclination to the other end surface 52e side from the parting line 54 toward the side surface 52b.

At the position of the parting line 54, the first power terminal 46a extends outward of the first insulator 52 from one of the end surfaces 52e of the first insulator 52. The contact portion 47a of the first power terminal 46a is bent at right angles to the side surface 52a side, and is opposed to the end surface 52e of the first insulator 52 with a gap. In addition, the contact portion 47a is bent substantially at right angles, and is located in the vicinity of the center of the first insulator 52, relative to the first insulator 52.

At the position of the parting line 54, the second power terminal 46b extends outward of the first insulator 52 from the other of the end surfaces 52e of the first insulator 52. In addition, the contact portion 47b of the second power terminal 46b is bent at right angles to the side surface 52a side, and is opposed to the end surface 52e of the first insulator 52 with a gap. Furthermore, the contact portion 47b is bent substantially at right angles, and is located in the vicinity of the center of the first insulator 52, relative to the first insulator 52.

The five signal terminals 50 project in the first direction from the top surface 52d of the first insulator 52 at the position of the parting line 54. In addition, each of the five signal terminals 50 is bent at two locations, and end portions 53a on the extension end side of the signal terminals 50 are located in the vicinity of the center of the first insulator 52. Conductive films (not shown) are formed on outer surfaces of at least the end portions 53a of the signal terminals 50.

The second insulator 62 is an insulation layer which insulates the structural members of the semiconductor device 16. It should suffice if the second insulator 62 is formed of a material with insulation properties, and the material thereof is not limited. The second insulator 62 covers the first radiation surface 34b and second radiation surface 36b. The second insulator 62 includes a planar, rectangular first surface 62a which covers the first radiation surface 34b and second radiation surface 36b, and a planar, rectangular second surface 62b which is opposed to the first surface 62a and is parallel to the imaginary plane including the first radiation surface 34b and second radiation surface 36b. The second insulator 62 is formed in a flat plate shape with a uniform thickness in the first direction. Since the first surface 62a is located on the imaginary plane including the first radiation surface 34b and second radiation surface 36b, the first surface 62a is composed of a planar surface. Since the second surface 62b is attached to a planar heat-receiving surface 18a of a radiator 12 illustrated in FIG. 6 (to be described later), the second surface 62b is composed of a planar surface. Incidentally, the first surface 62a and second surface 62b may have shapes other than the rectangular shape. The second insulator 62 is formed in the flat plate shape in order to make the distance from the first radiation surface 34b to the heat-receiving 18a substantially equal to the distance from the second radiation surface 36b to the heat-receiving 18a. The thickness in the first direction of the second insulator 62 is determined to be a predetermined thickness, taking into account the balance between the insulation properties for insulation from the heat-receiving surface 18a of the radiator 12 shown in FIG. 6 and the heat radiation properties of the first conductor 34 and second conductor 36. The thickness of the second insulator 62 is set at, for example, 0.2 mm.

By the above, the first conductor 34 is covered, without exposure, with either the first insulator 52 or the second insulator 62, and thereby the first conductor 34 is insulated. Similarly, the second conductor 36 is covered, without exposure, with either the first insulator 52 or the second insulator 62, and thereby the second conductor 36 is insulated.

Next, as an example of a device in which the above-described semiconductor device 16 is mounted, a semiconductor power converter 10 will be described.

Figure 5:
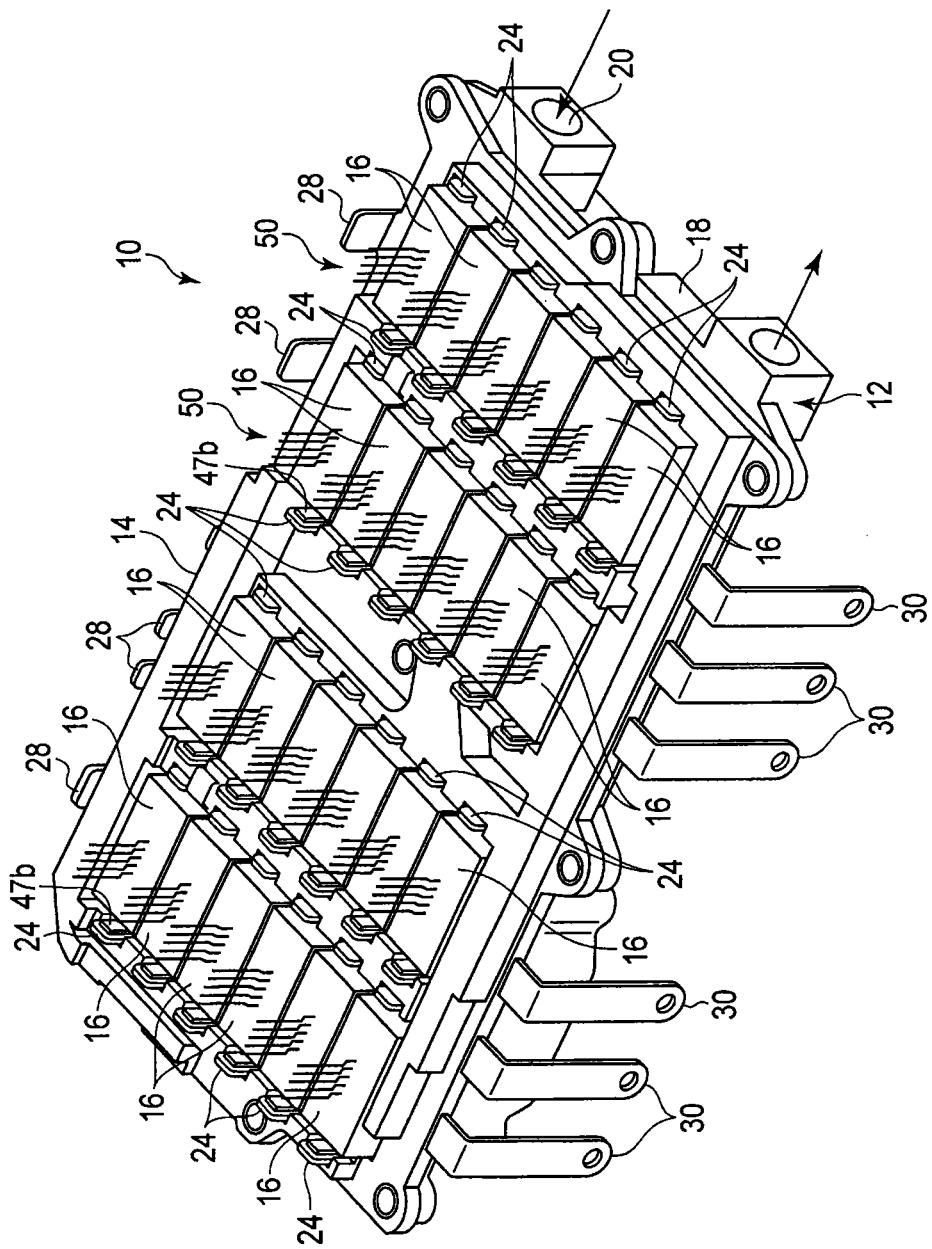
FIG. 5 is a perspective view illustrating an example of a semiconductor power converter in a state in which a control circuit board is removed.

FIG. 5 is a perspective view illustrating an example of the semiconductor power converter 10 in a state in which a control circuit board is removed.

Figure 6:
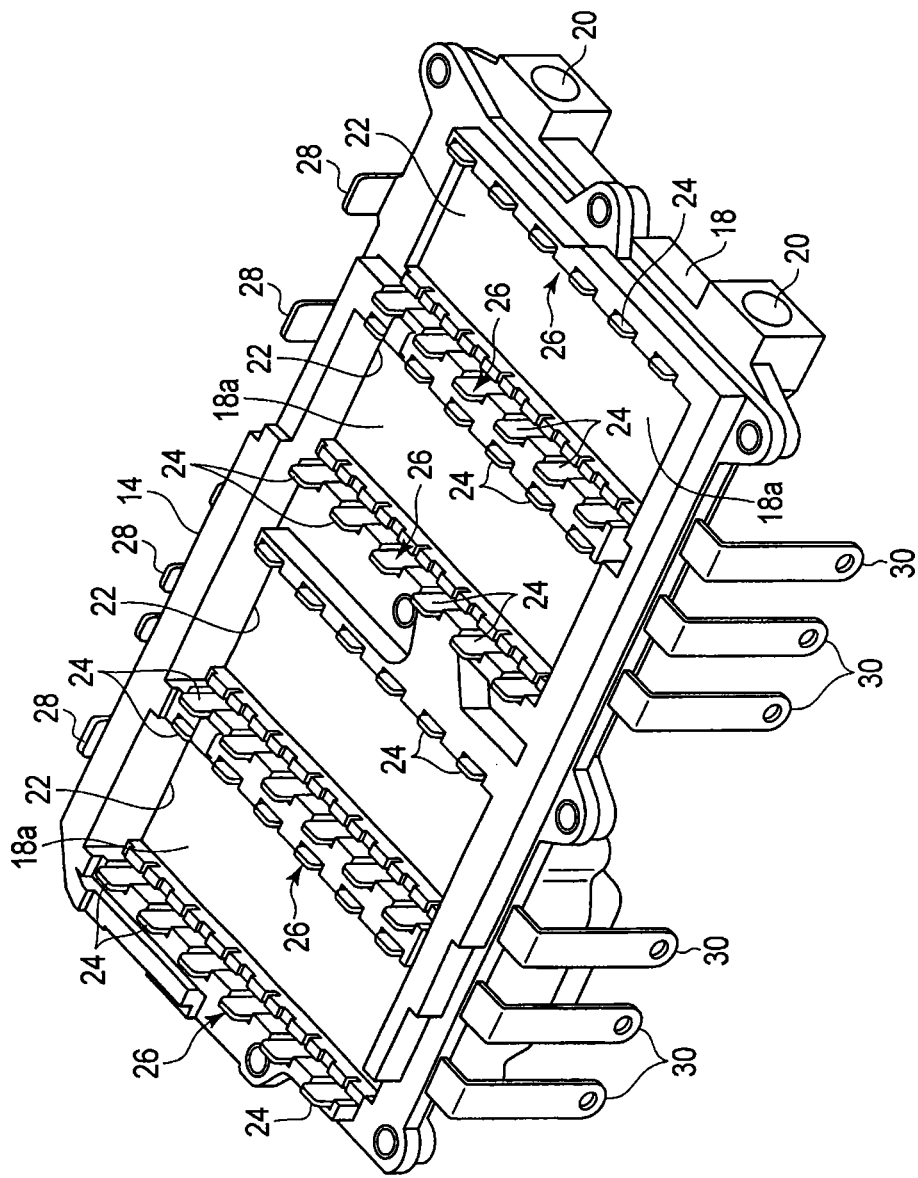
FIG. 6 is a perspective view illustrating an example of a support frame and a radiator of the semiconductor power converter.

FIG. 6 is a perspective view illustrating an example of a support frame 14 and a radiator 12 of the semiconductor power converter 10.

FIG. 7 is a perspective view illustrating an example of the entirety of the semiconductor power converter 10 including the control circuit board.

As illustrated in FIG. 5 to FIG. 7, the semiconductor power converter 10 includes a radiator 12, a support frame 14 fixed on the radiator 12, and a plurality of semiconductor devices 16 which are mounted on the radiator 12 and are supported by the support frame 14.

The radiator 12 includes a flat, rectangular parallelepipedic cooling block 18 having a planar, rectangular heat-receiving surface 18a. The cooling block 18 is formed of, for example, aluminum. In addition, a coolant path 20 for flowing a coolant such as water is formed in the cooling block 18.

The support frame 14 integrally includes a rectangular outer frame having a size corresponding to the heat-receiving surface 18a, and a plurality of mutually parallel coupling beams spanning the outer frame. The outer frame and the coupling beams form, for example, rectangular installation space parts 22 which are arranged in four rows. In addition, the support frame 14 is provided with a plurality of bus bars 26 including a plurality of connection terminals 24 to which semiconductor devices 16 are electrically connected, as will be described later, a plurality of input terminals 28, and two sets of three-phase output terminals 30. The connection terminals 24 of the bus bars 26 are disposed such that a plurality of connection terminals 24 are arranged at intervals along each side edge of each installation space part 22. In addition, the support frame 14 is formed integral with the plural terminals by a resin, for example, by insert mold. Furthermore, the support frame 14 is fixed on the heat-receiving surface 18a of the cooling block 18, for example, by a plurality of screws.

As illustrated in FIG. 5, the semiconductor devices 16 are disposed on the support frame 14 in four rows, for example, in units of six. In each row, the six semiconductor devices 16 are disposed in the installation space part 22 of the support frame 14, and are installed on the heat-receiving surface 18a such that the second surfaces 62a of the second insulators 62 are put in contact with the heat-receiving surface 18a of the radiator 12. The second surfaces 62a of the second insulators 62 are attached to the heat-receiving surface 18a, for example, by an adhesive. The first conductors 34 and second conductors 36 are thermally connected to the radiator 12 via the second insulators 62. The heat produced by the first semiconductor elements 38 and second semiconductor elements 40 is dissipated to the radiator 12 via the first conductors 34 and second conductors 36. The power terminals of each semiconductor device 16 are put in contact with the connection terminals 24 of the bus bars 26, and are electrically connected to the bus bars 26. In addition, the plural signals terminals 50 of each semiconductor device 16 project in the first direction.

In the semiconductor device 16 of this embodiment, as described above, the first radiation surface 34b and second radiation surface 36b are already covered with the second insulator 62. Thus, when the semiconductor device 16 of this embodiment is disposed on the heat-receiving surface 18a, the semiconductor device 16 requires no further insulating process for insulation from the heat-receiving surface 18a.

In addition, when the semiconductor device 16 of this embodiment is disposed on the heat-receiving surface 18a, the distance from the first radiation surface 34b to the heat-receiving surface 18a and the distance from the second radiation surface 36b to the heat-receiving surface 18a can be controlled by the second insulator 62 alone. As described above, the thickness in the first direction of the second insulator 62 is determined to be a predetermined thickness, taking into account the balance between the insulation properties and the heat radiation properties. By simply placing the semiconductor device 16 on the heat-receiving surface 18a, the distance from the first radiation surface 34b to the heat-receiving surface 18a and the distance from the second radiation surface 36b to the heat-receiving surface 18a become the predetermined distance defined by the second insulator 62. Thus, the semiconductor device 16 requires no further distance adjustment after the disposition on the heat-receiving surface 18a.

Furthermore, by simply placing the semiconductor device 16 of this embodiment on the heat-receiving surface 18a, the imaginary plane including the first radiation surface 34b and second radiation surface 36b is set in a parallel relationship with the heat-receiving surface 18a. The reason for this is that the imaginary plane including the first radiation surface 34b and second radiation surface 36b is in the parallel relationship with the second surface 62b of the second insulator 62, and accordingly this imaginary plane is set in the parallel relationship with the heat-receiving surface 18a that is in contact with the second surface 62b. Thus, the distance from the first radiation surface 34b to the heat-receiving surface 18a corresponds to the predetermined distance defined by the second insulator 62, and is equal in any area of the first radiation surface 34b. A case is now assumed in which the first radiation surface 34b is not in the parallel relationship with the heat-receiving surface 18a. In this case, the distance from the first radiation surface 34b to the heat-receiving surface 18a is different between a first area and a second area of the first radiation surface 34b. For example, there is a case in which, even if the distance from the first area of the first radiation surface 34b to the heat-receiving surface 18a is a predetermined distance which is set by taking into account the insulation properties and the heat radiation properties, the distance from the second area of the first radiation surface 34b to the heat-receiving surface 18a is greater than this predetermined distance. The radiation properties in the second area become lower than the radiation properties in the first area. From the above, the radiation properties of the entirety of the first conductor 34 in the case where the first radiation surface 34b is in the parallel relationship with the heat-receiving surface 18a with the predetermined distance are higher than the radiation properties of the entirety of the first conductor 34 in the case where the first radiation surface 34b is not in the parallel relationship with the heat-receiving surface 18a. The same applies to the relationship between the second radiation surface 36b and the heat-receiving surface 18a. As regards the semiconductor device 16 of the present embodiment, even if the semiconductor device 16 is simply placed on the heat-receiving surface 18a, the radiation properties of the first conductor 34 and second conductor 36 do not deteriorate.

Besides, even when a plurality of semiconductor devices 16 of this embodiment are disposed on the heat-receiving surface 18a, the above-described radiation properties of the semiconductor devices 16 and the capabilities of the respective semiconductor devices 16, which result from the radiation properties, do not vary among the semiconductor devices 16. The reason for this is that, in any of the semiconductor devices 16, as described above, the first radiation surface 34b and second radiation surface 36b can be made parallel to the heat-receiving surface 18a by the second insulator 62, and the distance from the first radiation surface 34b to the heat-receiving surface 18a and the distance from the second radiation surface 36b to the heat-receiving surface 18a can be set at the predetermined distance which is determined by taking into account the insulation properties and the heat radiation properties.

For example, a semiconductor device, in which the second insulator 62 is not attached in advance, is now assumed. When this semiconductor device is disposed on the heat-receiving surface 18a, the first radiation surface 34b and second radiation surface 36b are insulated from the heat-receiving surface 18a, and the first radiation surface 34b and second radiation surface 36b are attached to the heat-receiving surface 18a, for example, by a resin which is spread and coated on the heat-receiving surface 18a. In this case, a high-precision control is required, such as coating the resin by uniformly setting the thickness of the resin on the heat-receiving surface 18a at a predetermined thickness. It is thus difficult to dispose the semiconductor device on the heat-receiving surface 18a such that the first radiation surface 34b and second radiation surface 36b are set in a parallel relationship with the heat-receiving surface 18a. In addition, it is difficult to dispose the semiconductor device on the heat-receiving surface 18a so as to keep the distance between the first radiation surface 34b and the heat-receiving surface 18a at a predetermined distance, which is determined by taking into account the balance between insulation properties and the heat radiation properties, over the entirety of the first radiation surface 34b. Similarly, it is difficult to dispose the semiconductor device on the heat-receiving surface 18a so as to keep the distance between the second radiation surface 36b and the heat-receiving surface 18a at this predetermined distance over the entirety of the second radiation surface 36b. Accordingly, when a plurality of such semiconductor devices are disposed on the heat-receiving surface 18a, the radiation properties of the respective semiconductor devices and the capabilities of the respective semiconductor devices, which result from the radiation properties, vary among the semiconductor devices. As a result, it is highly possible that the semiconductor device, in which the second insulator 62 is not attached in advance, causes deterioration in capabilities of the semiconductor power converter due to a defect in disposition.

By the above, according to the present embodiment, even when a plurality of semiconductor devices 16 are disposed on the heat-receiving surface 18a, the semiconductor devices 16 can easily be fixed on the heat-receiving surface 18a of the radiator 12, without deteriorating the radiation properties. As a result, according to the present embodiment, it is possible to prevent the deterioration in capabilities of the semiconductor power converter 10 due to a defect in disposition of the semiconductor devices 16.

As illustrated in FIG. 7, the semiconductor power converter 10 includes a control circuit board 32 which controls the input/output and operation of the semiconductor devices 16 and the entire device. The control circuit board 32 is formed in a rectangular shape with substantially the same size as the support frame 14. The control circuit board 32 is disposed in a manner to overlap the semiconductor devices 16, and is attached to the support frame 14 by fixing screws or the like (not shown). The signal terminals 50 of each semiconductor device 16 are electrically connected to the control circuit board 32.

The semiconductor devices 16 are disposed in the installation space parts 22 of the support frame 14, and the semiconductor devices 16 are disposed on the heat-receiving surface 18a such that the second surfaces 62c of the second insulators 62 are put in contact with the heat-receiving surface 18a. The contact portions 47a, 47b of the first power terminals 46a and second power terminals 46b of the semiconductor devices 16 are put in contact with the connection terminals 24 of the bus bars 26, and are electrically connected to the bus bars 26. In addition, the plural signal terminals of each semiconductor device 16 project upward.

Among the plural semiconductor devices 16 arranged in one row, two neighboring semiconductor devices 16 are disposed in a state in which side surfaces of the first insulators 52 are opposed in proximity or are put in contact. Of the two neighboring semiconductor devices 16, one semiconductor device 16 may be disposed in a direction reversed over 180°, relative to the other semiconductor device 16. Even when the semiconductor 16 is disposed in either direction, the first power terminal 46a and second power terminal 46b of the semiconductor device 16 are exactly engaged with the connection terminals 24 of the bus bars 26. In addition, in this case, too, even when the semiconductor 16 is disposed in either direction, the signal terminals 50 of the semiconductor device 16 are located at the central part of the insulator 52 and are disposed at a predetermined position relative to the control circuit board 32.

As illustrated in FIG. 7, by disposing the control circuit board 32 on the semiconductor devices 16, the end portions of the signal terminals 50 of each semiconductor device 16 are passed through through-holes which are formed in the control circuit board 32, and are electrically connected to the control circuit board 32 by soldering or the like (not illustrated).

Incidentally, in the semiconductor device 16 of the present embodiment, the second insulator 62 may have a higher heat conductivity than the first insulator 52. The first insulator 52 is formed of an inexpensive material in which a silica filler is mixed in a resin. As the resin, for example, an epoxy resin is used, but the resin is not limited to this example. The second insulator 62 is formed of a material in which a heat-conductive, insulative filler is mixed in a resin. As this resin, for example, an epoxy resin or a polyimide resin is used, but the resin is not limited to these examples. As the filler, a boron nitride (BN) filler or an alumina filler is used, but the filler is not limited to these examples. When the semiconductor device 16 is disposed on the heat-receiving surface 18a, the second insulator 62 exists between the first radiation surface 34b and the heat-receiving surface 18a and between the second radiation surface 36b and the heat-receiving surface 18a. Specifically, the second insulator 62 is located in a shortest heat radiation path from the first radiation surface 34b to the heat-receiving surface 18a and from the second radiation surface 36b to the heat-receiving surface 18a. If the second insulator 62 is formed of the material with high heat conductivity as described above, the radiation properties of the first conductor 34 and second conductor 36 are enhanced. On the other hand, when the semiconductor device is disposed on the heat-receiving surface 18a, the first insulator 52 exists neither between the first radiation surface 34b and the heat-receiving surface 18a nor between the second radiation surface 36b and the heat-receiving surface 18a. The first insulator 52 is not located in the shortest heat radiation path from the first radiation surface 34b to the heat-receiving surface 18a and from the second radiation surface 36b to the heat-receiving surface 18a. Thus, even if the first insulator 52 does not have high heat conductivity, the radiation properties of the entirety of the semiconductor device 16 do not deteriorate. Incidentally, although the first insulator 52 may be formed of a material with high heat conductivity like the second insulator 62, the material with high heat conductivity incurs a high cost. Thus, if the cost is taken into account, it is preferable that the first insulator 52 is formed of an inexpensive material with a lower heat conductivity than the second insulator 612.

In the meantime, when the second insulator 62 is formed of the above-described material in which a filler with heat conductivity and insulation properties is mixed in a resin, the second surface 62b may be subjected to a cutting process. The cutting process is performed by, for example, a milling process using a diamond chip. On the second surface 62b, the filler appears as fine asperities by the cutting process. Thus, the second surface 62b becomes a cut surface in a rough condition. When the semiconductor device 16 is attached on the heat-receiving surface 18a of the radiator 12 by, for example, a silicone adhesive, the silicone adhesive enters the asperities on the second surface 62b, and is cured. The strength of coupling between the semiconductor device 16 and the radiator 12 increases by the anchor effect by the asperities on the second surface 62b.

Figure 8:
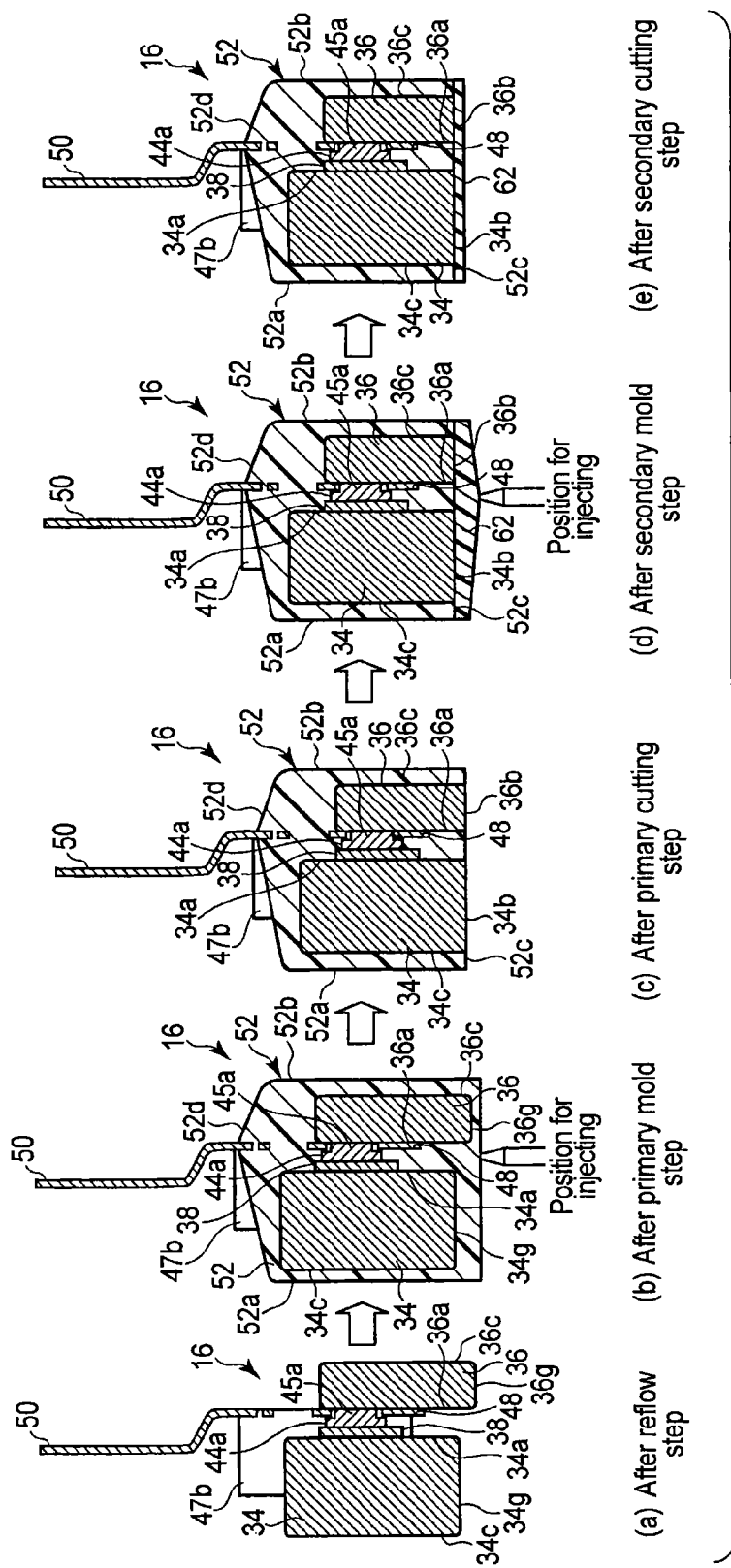
FIG. 8 is a view for describing an example of a method of manufacturing the semiconductor device of the embodiment.

FIG. 8 is a view for describing an example of a method of manufacturing the semiconductor device 16 of the embodiment. Incidentally, FIG. 8 is a view illustrating an example of the cross section of the semiconductor device 16 in a plane perpendicular to the first coupling surface 34a and first radiation surface 34b. The manufacturing method of the semiconductor device 16 includes, for example, a reflow step, a primary mold step, a primary cutting step, a secondary mold step, and a secondary cutting step.

Part (a) of FIG. 8 is a view illustrating a state after a reflow step of the semiconductor device 16. The reflow step is a step of coupling the structural members of the semiconductor device 16 by soldering.

In the reflow step, the first conductor 34, second conductor 36, first semiconductor element 38, second semiconductor element 40, first convex conductor 44a, second convex conductor 44b, first power terminal 46a, connection member 48 and signal terminals 50 are coupled, as has been described with reference to FIG. 1.

In the reflow step, the first electrode 38a, which is included in the first semiconductor element 38, is electrically connected to the first coupling surface 34a which is included in the first conductor 34, and the second electrode 38b, which is included in the first semiconductor element 38, is electrically connected to the second coupling surface 36a which is included in the second conductor 36 and is opposed to the first coupling surface 34a. Similarly, the first electrode 40a, which is included in the second semiconductor element 40, is electrically connected to the first coupling surface 34a which is included in the first conductor 34, and the second electrode 40b, which is included in the second semiconductor element 40, is electrically connected to the second coupling surface 36a which is included in the second conductor 36 and is opposed to the first coupling surface 34a. In the meantime, the first conductor 34 at the time of the reflow step includes a surface 34g which is perpendicular to the first coupling surface 34a and is opposed to the surface 34d. The first conductor 34 at the time of the reflow step is formed to have a width in the direction perpendicular to the surface 34d, which is greater than the width of the first conductor 34 described with reference to FIG. 1. Similarly, the second conductor 36 at the time of the reflow step includes a surface 36g which is perpendicular to the second coupling surface 36a and is opposed to the surface 36d. The second conductor 36 at the time of the reflow step is formed to have a width in the direction perpendicular to the surface 36d, which is greater than the width of the second conductor 36 described with reference to FIG. 1. The reason for this is that there is a case in which the surface 34g of the first conductor 34 is not located on the imaginary plane including the surface 36g of the second conductor 36, owing to non-uniformity of positions of mounting of parts at the time of the reflow step. The first conductor 34 and second conductor 36 have such sizes as to have allowances for forming on the first conductor 34 the first radiation surface 34b which is perpendicular to the first coupling surface 34a, and for forming on the second conductor 36 the second radiation surface 36b which is perpendicular to the second coupling surface 36a and is located on the imaginary plane including the first radiation surface 34b, by cutting the surface 34g of the first conductor 34 and the surface 36g of the second conductor 36 in a primary cutting step which is to be described later.

Part (b) of FIG. 8 is a view illustrating a state after a primary mold step of the semiconductor device 16. The primary mold step is a step of sealing, with use of the first insulator 52, the first semiconductor element 38 and second semiconductor element 40, and covering the first conductor 34, second conductor 36, first convex conductor 44a, second convex conductor 44b, connection member 48, the proximal end portion of the first power terminal 46a, the proximal end portion of the second power terminal 46b, and the proximal end portions of the signal terminals 50. The primary mold step is performed by, for example, transfer mold in which a first resin material is injected in a mold (not shown). The first resin material forms the first insulator 52. A gate position for injecting the first resin material is disposed near the surface 34g of the first conductor 34 or near the surface 36g of the second conductor 36. The primary mold step can be performed by an existing mold apparatus. The mold temperature is, for example, 180° C., and the forming pressure is, for example, about 15 MPa. By the primary mold step, the first insulator 52 covers the entire surfaces of the first conductor 34 and the entire surfaces of the second conductor 36.

Part (c) of FIG. 8 is a view illustrating a state after a primary cutting step of the semiconductor device 16. The primary cutting step is a step of forming on the first conductor 34 the first radiation surface 34b which is perpendicular to the first coupling surface 34a and is exposed from the first insulator 52, and forming on the second conductor 36 the second radiation surface 36b which is perpendicular to the second coupling surface 36a, is located on the imaginary plane including the first radiation surface 34b and is exposed from the first insulator 52, by cutting parts of the first insulator 52, first conductor 34 and second conductor 36. Incidentally, aside from the cutting process, grinding, polishing or cutting-off may be performed. Thus, the cutting process in the present specification may also be referred to as removal machining, which is a general term of such processes.

The direction of cutting of the semiconductor device 16 is a direction (hereinafter referred to as second direction) which is perpendicular to a plane that is perpendicular to the first coupling surface 34a or second coupling surface 36a. The direction of cutting of the semiconductor device 16 is also a direction which is perpendicular to the surface 34g, if the surface 34g is formed of a planar surface perpendicular to the first coupling surface 34a. Similarly, the direction of cutting of the semiconductor device 16 is also a direction which is perpendicular to the surface 36g, if the surface 36g is formed of a planar surface perpendicular to the second coupling surface 36a. The primary cutting step is performed, along the second direction, from the outer surface of the first insulator 52 in the vicinity of the surface 34g or surface 36g. To begin with, by the primary cutting step, the first insulator 52 covering the surface 34g and the first insulator 52 covering the surface 36g are cut. After the surface 34g is exposed, if the first conductor 34 is further cut in the second direction from the surface 34g side, a surface (first radiation surface 34b described in FIG. 1), which is perpendicular to the first coupling surface 34a and is exposed from the first conductor 34, is formed on the first conductor 34. After the surface 36g is exposed, if the second conductor 36 is further cut in the second direction from the surface 36g side, a surface (second radiation surface 36b described in FIG. 1), which is perpendicular to the second coupling surface 36a, is located on the imaginary plane including the first radiation surface 34b and is exposed from the first conductor 34, is formed on the second conductor 36. With the cutting of the first conductor 34, parts of the first insulator 52 covering the first coupling surface 34a, surface 34c, surface 34e and surface 34f of the first conductor 34 are also cut. Similarly, with the cutting of the second conductor 36, parts of the first insulator 52 covering the second coupling surface 36a, surface 36c, surface 36e and surface 36f of the second conductor 36 are also cut. A bottom surface 52c, which is located on the imaginary plane including the first radiation surface 34b and second radiation surface 36b, is formed on the first insulator 52. The primary cutting step is performed by, for example, a milling process using a diamond chip.

Part (d) of FIG. 8 is a view illustrating a state after a secondary mold step of the semiconductor device 16. The secondary mold step is a step of covering the first radiation surface 34b and second radiation surface 36b by the second insulator 62. The secondary mold step is performed by, for example, transfer mold in which a second resin material for forming the second insulator 62 is injected in a mold (not shown). A gate position for injecting the second resin material is disposed at a position opposed to any one of the first radiation surface 34b, second radiation surface 36b and bottom surface 52c. The mold temperature is, for example, 180° C., and the forming pressure is, for example, about 15 MPa. By the secondary mold step, the second insulator 62 is formed to cover the first radiation surface 34b and second radiation surface 36b. The second insulator 62 includes the first surface 62a which covers the first radiation surface 34b and second radiation surface 36b. The first surface 62a corresponds to the imaginary plane including the first radiation surface 34b and second radiation surface 36b. Further, the second insulator 62 includes a surface opposed to the surface 62a. On this surface, in some cases, a gate trace, a parting line, and a stepped part of a parting portion are formed due to the secondary mold step. The surface that is opposed to the first surface 62a needs to be formed of a planar surface from which a gate trace, etc. have been cut, since this surface comes in contact with the planar heat-receiving surface 18a of the radiator 12, as described above. The surface opposed to the first surface 62a is machined to be a planar surface, which is parallel to the imaginary plane including the first radiation surface 34b and second radiation surface 36b, by a secondary cutting step which will be described later. Thus, in the secondary mold step, the second insulator 62 is formed on the semiconductor device 16 so as to have a greater thickness than a preset predetermined thickness in the direction (the first direction described above with reference to FIG. 1) which is perpendicular to the imaginary plane including the first radiation surface 34b and second radiation surface 36b, so that the second insulator 62 has this preset predetermined thickness after a secondary cutting step which is to be described later.

Part (e) of FIG. 8 is a view illustrating a state after a secondary cutting step of the semiconductor device 16. The secondary cutting step is a step of forming on the second insulator 62 the second surface 62b which is opposed to the first surface 62a covering the first radiation surface 34b and second radiation surface 36b and is parallel to the imaginary plane including the first radiation surface 34b and second radiation surface 36b, within such a range that the first radiation surface 34b of the first conductor 34 and second radiation surface 36b of the second conductor 36 are not exposed.

The direction of cutting of the semiconductor device 16 is a first direction. Incidentally, the first direction may correspond to the second direction in the primary cutting step. The second insulator 62 is cut along the first direction from the surface, which is opposed to the first surface 62a, toward the first surface 62a. The second insulator 62 is cut until having a preset predetermined thickness in the direction perpendicular to the imaginary plane including the first radiation surface 34b and second radiation surface 36b, within such a range that the first radiation surface 34b of the first conductor 34 and second radiation surface 36b of the second conductor 36 are not exposed.

After the secondary cutting step, the planar second surface 62b, which is opposed to the first surface 62a and is parallel to the imaginary plane including the first radiation surface 34b and second radiation surface 36b, is formed on the second insulator 62. The second insulator 62 is formed in a flat plate shape with a preset predetermined uniform thickness in the first direction. A gate trace, a parting line, and a stepped part of a parting portion, which have been formed on the second insulator 62 in the primary mold step, are removed from the second insulator 62 by the secondary cutting step.

The secondary cutting step, like the primary cutting step, is performed by, for example, a milling process using a diamond chip. The precision in the secondary cutting step is determined by only the mechanical machining precision. Thus, the thickness of the second insulator 62 in the first direction can be uniformly set with high precision by machining.

According to the manufacturing method of the semiconductor device 16 of the embodiment, by simply using existing devices such as a mold device and a cutting device, it is possible to machine with high precision the second insulator 62 attached to the semiconductor device 16 such that the thickness of the second insulator 62 in the first direction becomes the preset predetermined thickness, and to machine with high precision the second surface 62b of the second insulator 62 such that the second surface 62b becomes parallel to the above-described imaginary plane.

By the above, according to the present embodiment, it is possible to manufacture the semiconductor device 16 which can easily be fixed on the heat-receiving surface 18a of the radiator 12 without deteriorating heat radiation properties, even when a plurality of semiconductor devices 16 are disposed on the heat-receiving surface 18a.

In the meantime, at the time of the secondary mold step, the gate position may be provided on a plane perpendicular to the imaginary plane including the first radiation surface 34b and second radiation surface 36b. Specifically, the direction of injection of the second resin material is parallel to the imaginary plane including the first radiation surface 34b and second radiation surface 36b. In this case, use may be made of a mold which can form the second insulator 62, which has the shape described with reference to FIG. 2, etc., on the semiconductor device 16. A gate trace or the like does not occur on the second surface 62b of the second insulator 62. Thus, the secondary cutting step becomes needless, and the manufacturing cost of the semiconductor device 16 decreases.

The above-described semiconductor device 16 is constructed as described below. The first semiconductor element 38 includes the first electrode 38a, and the second electrode 38b formed on the surface thereof opposed to the first electrode 38a. The same applies to the second semiconductor element 40. The first conductor 34 includes the first coupling surface 34a which is electrically connected to the first electrode 38a and first electrode 40a, and the first radiation surface 34b. The second conductor 36 includes the second coupling surface 36a which is electrically connected to the second electrode 38b and second electrode 40b, and the second radiation surface 36b. The first insulator 52 is composed of a first insulative material and is formed such that first insulator 52 seals the first semiconductor element 38 and second semiconductor element 40. The first insulator 52 can also be referred to as a first envelope portion. The second insulator 62 is composed of a second insulative material having a higher coefficient of thermal conductivity than the first insulative material and is formed in contact with the first radiation surface 34b and the second radiation surface 36b. The second insulator 62 can also be referred to as a second envelope portion. An envelope 71 of the semiconductor device 16 is composed of the first insulator 52 and second insulator 62.

Additionally, the second radiation surface 36b is located on an imaginary plane including the first radiation surface 34b.

Additionally, the second insulator 62 includes the first surface 62a which includes an area in contact with the first radiation surface 34b and an area in contact with the second radiation surface 36b, and the second surface 62b which is parallel to the first surface 62a.

Incidentally, the filler included in the second insulator 62 has a higher coefficient of thermal conductivity than the second insulative material (e.g. resins as described above).

The fabrication steps of the manufacturing method of the above-described semiconductor device 16 are performed as described below. The above-described reflow step is a step of electrically connecting the first electrode 38a, which is included in the first semiconductor element 38, to the first coupling surface 34a which is included in the first conductor 34, and electrically connecting the second electrode 38b, which is included in the first semiconductor element 38 and formed on the surface thereof opposed to the first electrode 38a, to the second coupling surface 36a which is included in the second conductor 36. The same applies to the second semiconductor element 40.

The above-described primary mold step is a step of forming the first insulator 52 by sealing the first semiconductor element 38 and second semiconductor element 40 with the first insulative material.

The above-described primary cutting step is a step of forming the first radiation surface 34b on the first conductor 34 and forming the second radiation surface 36a on the second conductor 36 by removing a part of the first insulator 52, a part of the first conductor 34 and a part of the second conductor 36.

The above-described second mold step is a step of forming the second insulator 62 with the second insulative material having a higher coefficient of thermal conductivity than the first insulative material, such that the second insulator 62 is in contact with the first radiation surface 34b and the second radiation surface 36b.

The above-described secondary cutting step is a step of forming on the second insulator 62 a surface which is parallel to the first radiation surface 34b by removing a part of the second insulator 62.

Additionally, in the primary cutting step, the step of forming the second radiation surface 36b on the second conductor 36 is a step of forming the second radiation surface 36b on an imaginary plane including the first radiation surface 34b.

Additionally, in the secondary cutting step, the step of forming on the second insulator 62 the surface which is parallel to the first radiation surface 34b is a step of forming on the second insulator 62 a surface which is opposed to a surface including the first radiation surface 34b and the second radiation surface 36b.

Incidentally, in the above-described embodiment, the description has been given of the example of the semiconductor device 16 in which the first coupling surface 34a and second coupling surface 36a (the first semiconductor element 38 and second semiconductor element 40 which are coupled to the first coupling surface 34a and second coupling surface 36a) are perpendicular to the heat-receiving surface 18a of the radiator 12. However, the angle to the heat-receiving surface 18a may be an angle other than the perpendicular angle, and is not specifically limited.

Next, another embodiment is described.

Figure 9:
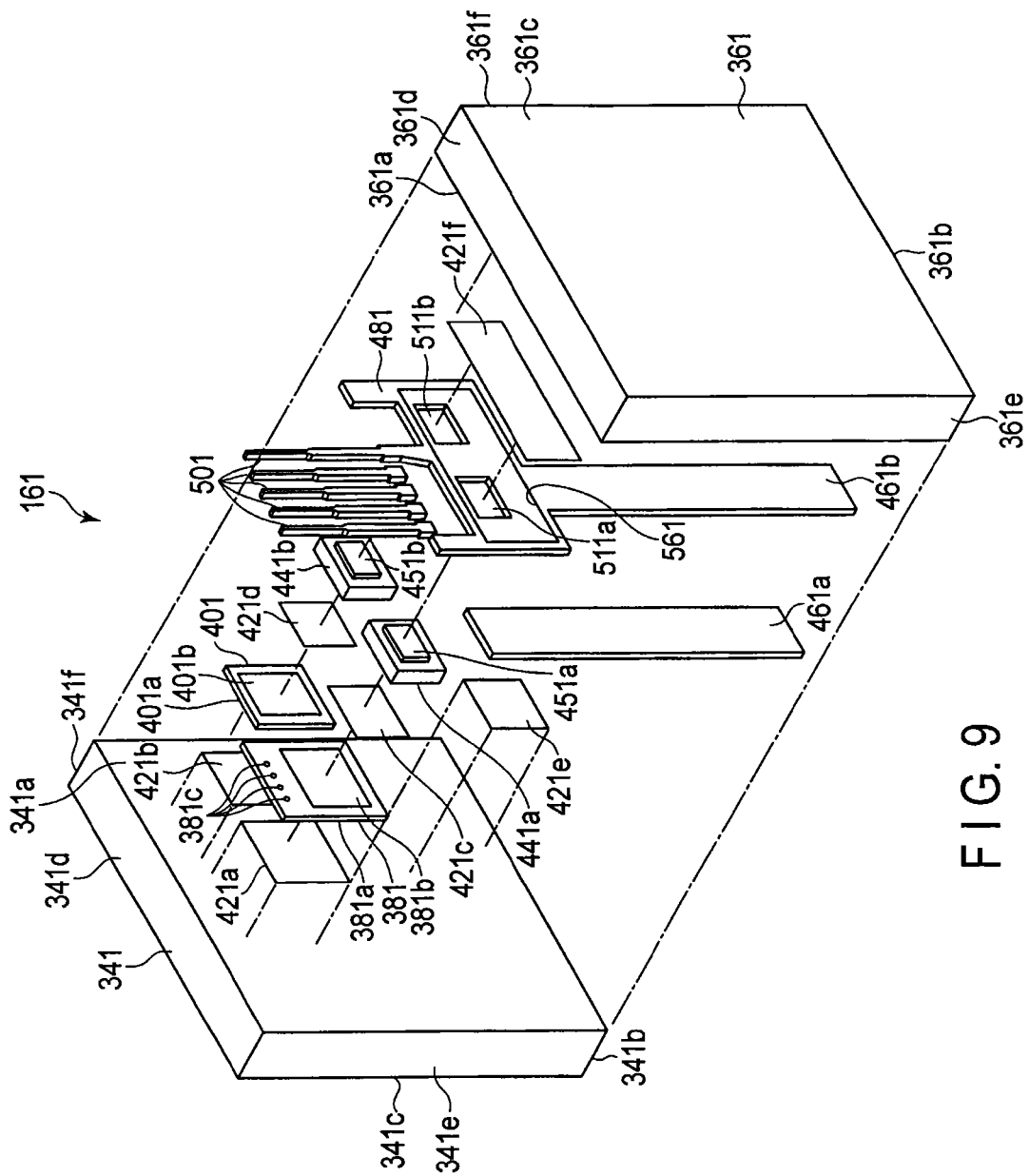
FIG. 9 is an exploded perspective view for describing an example of structural members of a semiconductor device of another embodiment.

FIG. 9 is an exploded perspective view for describing an example of structural members of a semiconductor device 161 according to anther embodiment. A description is mainly given of points which are different from the structure and manufacturing method of the above-described semiconductor device 16, and a description of the same parts is omitted.

The semiconductor device 161 includes a first conductor 341, a second conductor 361, a first semiconductor element 381, a second semiconductor element 401, a first convex conductor 441a, a second convex conductor 441b, a first power terminal 461a, a second power terminal 461b, a connection member 481, and a plurality of coupling members 421a to 421f.

The first conductor 341, like the above-described first conductor 34, is formed, for example, of copper in a substantially rectangular parallelepipedic shape. The first conductor 341 includes a planar, rectangular first coupling surface 341a, and a planar, rectangular first radiation surface 341c which is opposed to the first coupling surface 341a. The first coupling surface 341a is substantially parallel to the first radiation surface 341c. Further, the first conductor 341 includes a planar, rectangular surface 341b which is perpendicular to the first coupling surface 341a and first radiation surface 341c; a planar, rectangular surface 341d which is opposed to the surface 341b and is perpendicular to the first coupling surface 341a and first radiation surface 341c; a planar, rectangular surface 341e which is perpendicular to the first coupling surface 341a and first radiation surface 341c; and a planar, rectangular surface 341f which is opposed to the surface 341e and is perpendicular to the first coupling surface 341a and first radiation surface 341c. Incidentally, it should suffice if the first conductor 341 includes the first coupling surface 341a and the first radiation surface 341c, and the first conductor 341 may have a shape other than the substantially rectangular parallelepipedic shape. The first coupling surface 341a may have a shape other than the rectangular shape. The first radiation surface 341c may have a shape other than the rectangular shape.

The second conductor 361, like the above-described second conductor 36, is formed, for example, of copper in a substantially rectangular parallelepipedic shape. The second conductor 361 includes a planar, rectangular second coupling surface 361a, and a planar, rectangular second radiation surface 361c which is opposed to the second coupling surface 361a. The second coupling surface 361a is substantially parallel to the second radiation surface 361c. Further, the second conductor 361 includes a planar, rectangular surface 361b which is perpendicular to the second coupling surface 361a and second radiation surface 361c; a planar, rectangular surface 361d which is opposed to the surface 361b and is perpendicular to the second coupling surface 361a and second radiation surface 361c; a planar, rectangular surface 361e which is perpendicular to the second coupling surface 361a and second radiation surface 361c; and a planar, rectangular surface 361f which is opposed to the surface 361e and is perpendicular to the second coupling surface 361a and second radiation surface 361c. The second coupling surface 361a is opposed to, and is substantially parallel to, the first coupling surface 341a. The second radiation surface 361c is opposed to, and is substantially parallel to, the first radiation surface 341c. A width between the second coupling surface 361a and second radiation surface 361c is substantially equal to a width between the first coupling surface 341a and first radiation surface 341c.

Incidentally, it should suffice if the second conductor 361 includes the second coupling surface 361a and the second radiation surface 361c, and the second conductor 361 may have a shape other than the substantially rectangular parallelepipedic shape. The second coupling surface 361a may have a shape other than the rectangular shape. The second radiation surface 361c may have a shape other than the rectangular shape.

The first semiconductor element 381 is constructed like the above-described first semiconductor element 38. The first semiconductor element 381 is interposed between the first conductor 341 and second conductor 361, and is coupled to these conductors. The first semiconductor element 381 includes a first electrode 381a and a second electrode 381b. The first semiconductor element 381 includes the first electrode 381a on a first surface thereof, and includes the second electrode 381b, which is different from the first electrode 381a, on a second surface thereof which is opposed to the first surface. A plurality of connection terminals 381c, for example, four connection terminals 381c, are formed on the second surface of the first semiconductor element 381.

The first semiconductor element 381 is disposed in parallel to the first coupling surface 341a of the first conductor 341, and the first electrode 381a (collector) is coupled to the first coupling surface 341a of the first conductor 341 by a first connection member, for example, a rectangular solder sheet 421a.

The second semiconductor element 401 is constructed like the above-described second semiconductor element 40. The second semiconductor element 401 is interposed between the first conductor 341 and second conductor 361, and is coupled to the first conductor 341 and second conductor 361. The second semiconductor element 401 includes a first electrode 401a on a first surface thereof, and a second electrode 401b, which is different from the first electrode 401a, on a second surface thereof which is opposed to the first surface.

The first electrode 401a of the second semiconductor element 401 is coupled to the first coupling surface 341a of the first conductor 341 by a second connection member, for example, a rectangular solder sheet 421b.

The first convex conductor 441a is constructed like the above-described first convex conductor 44a. The first convex conductor 441a is coupled onto the second electrode 381b of the first semiconductor element 381 by a third connection member, for example, a rectangular solder sheet 421c.

The first convex conductor 441a includes, as one body, a projection portion 451a which is constructed like the above-described projection portion 45a. The planar major surface of the main body of the first convex conductor 441a is electrically and mechanically coupled to the second electrode 381b of the first semiconductor element 381 by a solder sheet 421c.

The second convex conductor 441b is constructed like the above-described second convex conductor 44b. The second convex conductor 441b is coupled onto the other electrode of the second semiconductor element 401 by a fourth connection member, for example, a rectangular solder sheet 421d. The second convex conductor 441b includes, as one body, a projection portion 451b which is constructed like the above-described projection portion 45b. In addition, the planar major surface of the main body of the second convex conductor 441b is electrically and mechanically coupled to the second electrode 401b of the second semiconductor element 401 by a solder sheet 421d.

The first power terminal 461a is independently formed, and a proximal end portion thereof is coupled to the first coupling surface 341a of the first conductor 341 by a fifth connection member, for example, a rectangular solder sheet 421e. The first power terminal 461a extends to such a position that the first power terminal 461a is not opposed to the first conductor 341 or second conductor 361.

The second power terminal 461b has its proximal end portion coupled to a connection member 481. The second power terminal 461b extends to such a position that the second power terminal 461b is not opposed to the first conductor 341 or second conductor 361.

The connection member 481 is constructed like the above-described connection member 48. In this connection member 481, a first opening 511a and a second opening 511b, which are formed like the above-described first opening 51a and second opening 51b, are formed in juxtaposition. In a surface of the connection member 481 on the second conductor 361 side, a recess 561, which is formed like the above-described recess 56, is formed.

The connection member 481 and second power terminal 461b are coupled to the first and second convex conductors 441a and 441b in the state in which the projection portions 451a and 451b of the first and second convex conductors 441a and 441b are engaged in the first opening 511a and second opening 511b, respectively.

In addition, the connection member 481 and the projection portions 451a and 451b of the first and second convex conductors 441a and 441b are electrically and mechanically coupled to the second coupling surface 361a of the second conductor 361 by a sixth connection member disposed in the recess 561 of the connection member 481, for example, a rectangular solder sheet 421f. Specifically, the three members, namely the connection member 481, the first, second convex conductor 441a, 441b and the second conductor 361, are mutually coupled by the solder sheet 421f.

By the above, the first semiconductor element 381 and second semiconductor element 401 are interposed and disposed between the first conductor 341 and second conductor 361. The first electrode 381a of the first semiconductor element 381 is electrically connected to the first coupling surface 341a of the first conductor 341, and the second electrode 381b of the first semiconductor element 381 is electrically connected to the second coupling surface 361a of the second conductor 361. Similarly, the first electrode 401a of the second semiconductor element 401 is electrically connected to the first coupling surface 341a of the first conductor 341, and the second electrode 401b of the second semiconductor element 401 is electrically connected to the second coupling surface 361a of the second conductor 361. For example, the first semiconductor element 381 and second semiconductor element 401 are disposed to be parallel to the first coupling surface 341a and first radiation surface 341c, and to the second coupling surface 361a and second radiation surface 361c.

Signal terminals 501 are constructed like the above-described signal terminals 50. The signal terminals 501 extend in parallel to the first coupling surface 341a of the first conductor 341. Proximal ends of four of the signal terminals 501 are connected to the connection terminals 381c of the first semiconductor element 381 by bonding wires (not shown).

Figure 10:
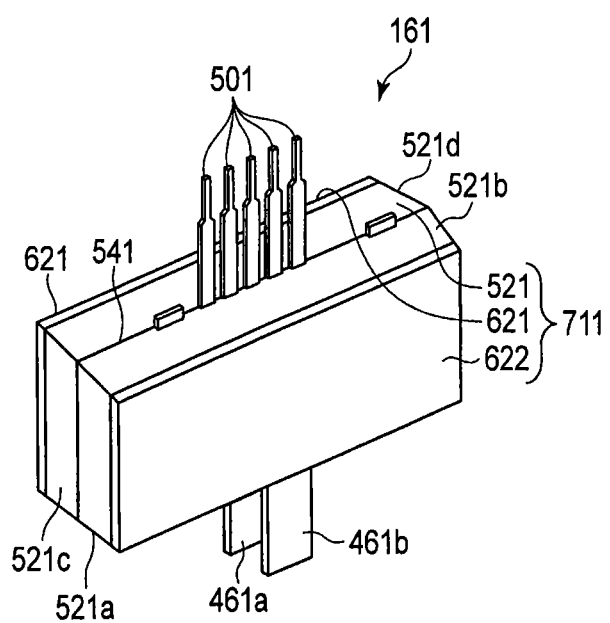
FIG. 10 is a perspective view illustrating an example of the semiconductor device of the another embodiment.

FIG. 10 is a perspective view illustrating an example of the semiconductor device 161.

The semiconductor device 161 further includes a first insulator 521, a second insulator 621 and a third insulator 622. In this embodiment, in a direction (hereinafter referred to as direction A) perpendicular to the surface 341b of the first conductor 341 (or the surface 361b of the second conductor 361), an outer surface on the side of the plural signal terminals 501 is referred to as a top surface of the semiconductor device 161, and an outer surface on the side of the surface 341b and surface 361b is referred to as a bottom surface of the semiconductor device 161. A direction perpendicular to the first coupling surface 341a (or second coupling surface 361a) is referred to as direction B.

The first insulator 521 is an insulation layer which insulates the structural members of the semiconductor device 161. The first insulator 521 seals the first semiconductor element 381 and second semiconductor element 401. In addition, the first insulator 521 covers the surfaces (first coupling surface 341a, surface 341b, surface 341d, surface 341e, surface 341f in the example shown in FIG. 9) of the first conductor 341, excluding the first radiation surface 341c of the first conductor 341, and the surfaces (second coupling surface 361a, surface 361b, surface 361d, surface 361e, surface 361f in the example shown in FIG. 9) of the second conductor 361, excluding the second radiation surface 361c of the second conductor 361. Furthermore, the first insulator 521 covers the first convex conductor 441a, second convex conductor 441b, connection member 481, the proximal end portion of the first power terminal 461a, the proximal end portion of the second power terminal 461b, and the proximal end portions of the signal terminals 501. The first insulator 521 is formed of, for example, an inexpensive material with insulation properties, in which a silica filler is mixed in a resin. As the resin, for example, an epoxy resin is used, but the resin is not limited to this example.

The first insulator 521 includes a bottom surface 521a, a top surface 521b which is opposed to the bottom surface 521a, an end surface 521c, an end face 521d, and a parting line 541. This parting line 541 is located in a plane including the connection member 481 of a lead frame, the first power terminal 461a and the second power terminal 461b, and is left along the bottom surface 521a, top surface 521b, end face 521c and end face 521d of the first insulator 521.

At the position of the parting line 541, the first power terminal 461a extends outward of the first insulator 521 from the bottom surface 521a of the first insulator 521. Similarly, at the position of the parting line 541, the second power terminal 461b extends outward of the first insulator 521 from the bottom surface 521a of the first insulator 521. Incidentally, at least one of the first power terminal 461a and second power terminal 461b may extend outward of the first insulator 521 from the end face 521c or end face 521d. The five signal terminals 501 project in the direction A from the top surface 521b of the first insulator 521 at the position of the parting line 541.

The second insulator 621 is an insulation layer which insulates the structural members of the semiconductor device 161. The second insulator 621 covers the first radiation surface 341c. The second insulator 621 includes a planar, rectangular first surface 621a (see FIG. 11) which covers the first radiation surface 341c, and a second surface 621b (see FIG. 11) which is opposed to the first surface 621a and is parallel to the first radiation surface 341c. The second surface 621b has a planar rectangular shape. The second insulator 621 is formed in a flat plate shape with a uniform thickness in the direction B. Since the second surface 621b of the second insulator 621 is attached to a planar heat-receiving surface of a radiator, the second surface 621b is composed of a planar surface. Incidentally, the first surface 621a and second surface 621b of the second insulator 621 may have shapes other than the rectangular shape.

The second insulator 621 is formed of an insulative material having a higher heat conductivity (coefficient of thermal conductivity) than the first insulator 521. The second insulator 621 is formed of, for example, a material in which a heat-conductive, insulative filler is mixed in a resin. As this resin, for example, an epoxy resin or a polyimide resin is used, but the resin is not limited to these examples. As the filler, a boron nitride (BN) filler or an alumina filler is used, but the filler is not limited to these examples.

The third insulator 622 is an insulation layer which insulates the structural members of the semiconductor device 161. The third insulator 622 covers the second radiation surface 361c. The third insulator 622 includes a planar, rectangular first surface 622a (see FIG. 11) which covers the second radiation surface 361c, and a second surface 622b (see FIG. 11) which is opposed to the first surface 622a (see FIG. 11) and is parallel to the second radiation surface 361c. The second surface 622b has a planar rectangular shape. The third insulator 622 is formed in a flat plate shape with a uniform thickness in the direction B. The thickness of the third insulator 622 in the direction B is substantially equal to the thickness of the second insulator 621 in the direction B. Since the second surface 622b of the third insulator 622 is attached to a planar heat-receiving surface of the radiator, the second surface 622b is composed of a planar surface. Incidentally, the first surface 622a and second surface 622b of the third insulator 622 may have shapes other than the rectangular shape. The third insulator 622 is formed of the same material as the second insulator 621. Specifically, the third insulator 622 is formed of an insulative material having a higher heat conductivity (coefficient of thermal conductivity) than the first insulator 521. Incidentally, the filler, which the second insulator 621 and third insulator 622 include, has a higher coefficient of thermal conductivity than a second insulative material (e.g. resins as described above).

By the above, the first conductor 341 is covered, without exposure, with either the first insulator 521 or the second insulator 621, and thereby the first conductor 341 is insulated. Similarly, the second conductor 361 is covered, without exposure, with either the first insulator 521 or the third insulator 622, and thereby the second conductor 361 is insulated.

The above-described semiconductor device 161 is constructed as described below. The first semiconductor element 381 includes the first electrode 381a, and the second electrode 381b formed on the surface thereof opposed to the first electrode 381a. The same applies to the second semiconductor element 401. The first conductor 341 includes the first coupling surface 341a which is electrically connected to the first electrode 381a and first electrode 401a, and the first radiation surface 341c. The second conductor 361 includes the second coupling surface 361a which is electrically connected to the second electrode 381b and second electrode 401b, and the second radiation surface 361c. The first insulator 521 is composed of a first insulative material and is formed such that the first insulator 521 seals the first semiconductor element 381 and second semiconductor element 401. The first insulator 521 can also be referred to as a first envelope portion. The second insulator 621 is composed of a second insulative material having a higher coefficient of thermal conductivity than the first insulative material and is formed in contact with the first radiation surface 341c. The third insulator 622 is composed of the second insulative material having a higher coefficient of thermal conductivity than the first insulative material and is formed in contact with the second radiation surface 361c. Each of the second insulator 621 and third insulator 622 can also be referred to as a second envelope portion. An envelope 711 of the semiconductor device 161 is composed of the first insulator 521, second insulator 621 and third insulator 622.

Additionally, the first radiation surface 341c is opposed to the first coupling surface 341a, and the second radiation surface 361c is opposed to the second coupling surface 361a. The second insulator 621 includes the first surface 621a including an area in contact with the first radiation surface 341c, and the second surface 621b which is parallel to the first surface 621a. The third insulator 622 includes the first surface 622a including an area in contact with the second radiation surface 361c, and the second surface 622b which is parallel to the first surface 622a.

The semiconductor device 161 with the above-described structure is mounted on a semiconductor power converter including a radiator. The semiconductor device 161 is mounted on the semiconductor power converter in the state in which the semiconductor device 161 is sandwiched between two planar heat-receiving surfaces which the radiator includes, from the second insulator 621 side and the third insulator 622 side. The second surface 621*b* of the second insulator 621 and the second surface 622*b* of the third insulator 622 are put in contact with the heat-receiving surfaces of the radiator. Specifically, the first semiconductor element 381 is cooled from both sides, that is, from the side of the heat-receiving surface opposed to the first electrode 381*a* and from the side of the heat-receiving surface opposed to the second electrode 381*b*. The second semiconductor element 401 is cooled from both sides, that is, from the side of the heat-receiving surface opposed to the first electrode 401*a* and from the side of the heat-receiving surface opposed to the second electrode 401*b*. The semiconductor device 161 radiates heat via the second insulator 621 and third insulator 622.

An example of the semiconductor device, which can cool semiconductor elements from both sides as described above, is a semiconductor device including a board which is formed of an insulative material. In this semiconductor device, the board is put in direct contact with the heat-receiving surface of the radiator. This semiconductor device is cooled via the board. However, the cost of the board formed of insulative material is high. By contrast, the semiconductor device 161 includes, in place of the board of insulative material, the second insulator 621 and third insulator 622 having insulation properties and heat radiation properties. This semiconductor device 161 can be fabricated at lower cost than the semiconductor device including the board of insulative material.

When the semiconductor device 161 is disposed on the radiator, the second insulator 621 is present between the first radiation surface 341*c* and the heat-receiving surface. Similarly, the third insulator 622 is present between the second radiation surface 361*c* and the heat-receiving surface. The second insulator 621 is located in a shortest heat radiation path from the first radiation surface 341*c* to the heat-receiving surface. Similarly, the third insulator 622 is located in a shortest heat radiation path from the second radiation surface 361*c* to the heat-receiving surface. Since the second insulator 621 and third insulator 622 are formed of the material with high heat conductivity as described above, the radiation properties of the first conductor 341 and second conductor 361 are enhanced.

Additionally, in the semiconductor device 161, as described above, the first radiation surface 341*c* and second radiation surface 361*c* are already covered with the second insulator 621 and third insulator 622. When the semiconductor device 161 is disposed on the radiator, the semiconductor device 161 requires no further insulating process for insulation from the heat-receiving surface.

Additionally, when the semiconductor device 161 is disposed on the radiator, the distance from the first radiation surface 341*c* to the heat-receiving surface and the distance from the second radiation surface 361*c* to the heat-receiving surface can be controlled by the second insulator 621 and third insulator 622. The thickness in the direction B of each of the second insulator 621 and third insulator 622 is determined to be a substantially equal predetermined thickness, taking into account the balance between the insulation properties from the heat-receiving surface and the heat radiation properties of the first conductor 341 and second conductor 361. By simply disposing the semiconductor device 161 on the radiator, the distance from the first radiation surface 341*c* to the heat-receiving surface and the distance from the second radiation surface 361*c* to the heat-receiving surface become predetermined distances defined by the second insulator 621 and third insulator 622. Thus, the semiconductor device 161 requires no further distance adjustment after the disposition on the radiator.

Additionally, even when a plurality of semiconductor devices 161 are disposed on the radiator, each semiconductor device 161 does not require the above-described insulating process for insulation from the heat-receiving surface or the distance adjustment. Thus, the radiation properties of the respective semiconductor devices 161 and the capabilities of the respective semiconductor devices 16, which result from the radiation properties, do not vary among the semiconductor devices 161.

By the above, even when a plurality of semiconductor devices 161 are disposed on the radiator, the semiconductor devices 161 can easily be fixed on the heat-receiving surface of the radiator, without deteriorating the radiation properties. As a result, it is possible to prevent the deterioration in capabilities of the semiconductor power converter due to a defect in disposition of the semiconductor devices 161.

In the meantime, the second surface 621*b* of the second insulator 621 and the second surface 622*b* of the third insulator 622 may be subjected to a cutting process. The cutting process is performed by, for example, a milling process using a diamond chip. On the second surface 621*b* of the second insulator 621 and the second surface 622*b* of the third insulator 622, the filler appears as fine asperities by the cutting process. Thus, the second surface 621*b* of the second insulator 621 and the second surface 622*b* of the third insulator 622 become cut surfaces in a rough condition. When the semiconductor device 161 is attached on the heat-receiving surface of the radiator by, for example, a silicone adhesive, the silicone adhesive enters the asperities on the second surface 621*b* of the second insulator 621 and the second surface 622*b* of the third insulator 622, and is cured. The strength of coupling between the semiconductor device 161 and the radiator increases by the anchor effect by the asperities.

Figure 11:
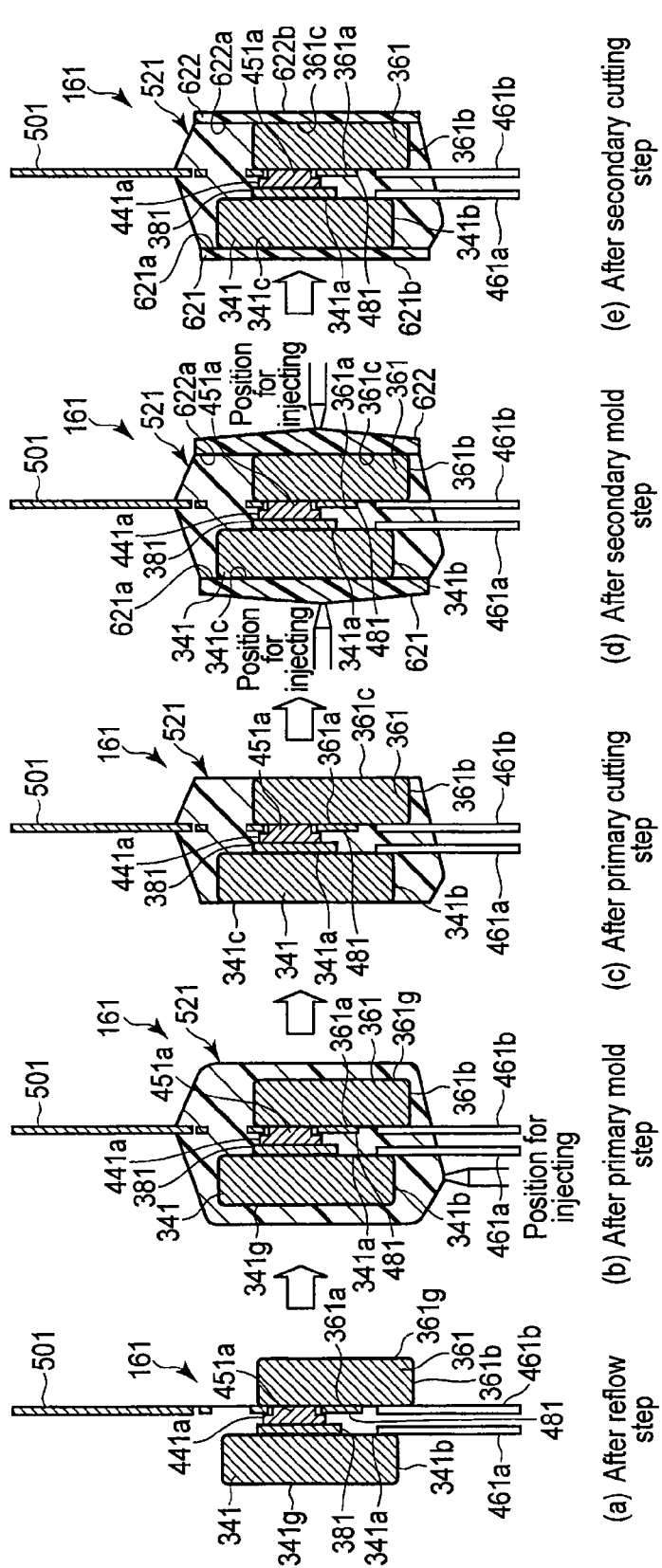
FIG. 11 is a view for describing an example of a method of manufacturing the semiconductor device of the another embodiment.

FIG. 11 is a view for describing an example of a method of manufacturing the semiconductor device 161. Incidentally, FIG. 11 is a view illustrating an example of the cross section of the semiconductor device 161 in a plane perpendicular to the first coupling surface 341*a* and second coupling surface 361*a*. Incidentally, FIG. 11 illustrates, for the purpose of convenience, the first power terminal 461*a* and second power terminal 461*b* in the semiconductor device 161 in order to indicate the positions of the first power terminal 461*a* and second power terminal 461*b*. Depending on a position in cross section, it is possible that at least one of the first power terminal 461*a* and second power terminal 461*b* does not appear. The manufacturing method of the semiconductor device 161 includes, for example, a reflow step, a primary mold step, a primary cutting step, a secondary mold step, and a secondary cutting step.

Part (a) of FIG. 11 is a view illustrating a state after a reflow step of the semiconductor device 161. The reflow step is a step of coupling the structural members of the semiconductor device 161 by soldering.

In the reflow step, the first conductor 341, second conductor 361, first semiconductor element 381, second semiconductor element 401, first convex conductor 441*a*, second convex conductor 441*b*, first power terminal 461*a*, connection member 481 and signal terminals 501 are coupled, as has been described with reference to FIG. 9.

In the reflow step, the first electrode 381*a*, which is included in the first semiconductor element 381, is electrically connected to the first coupling surface 341*a* which is included in the first conductor 341, and the second electrode 381*b*, which is included in the first semiconductor element 381, is electrically connected to the second coupling surface 361*a* which is included in the second conductor 361 and is opposed to the first coupling surface 341*a*. Similarly, the first electrode 401a, which is included in the second semiconductor element 401, is electrically connected to the first coupling surface 341a which is included in the first conductor 341, and the second electrode 401b, which is included in the second semiconductor element 401, is electrically connected to the second coupling surface 361a which is included in the second conductor 361 and is opposed to the first coupling surface 341a. In the meantime, the first conductor 341 at the time of the reflow step includes a planar, rectangular surface 341g which is opposed to the first coupling surface 341a. The first conductor 341 at the time of the reflow step is formed to have a width in the direction B, which is greater than the width in the direction B of the first conductor 341 described with reference to FIG. 9. Similarly, the second conductor 361 at the time of the reflow step includes a planar, rectangular surface 361g which is opposed to the second coupling surface 361a. The second conductor 361 at the time of the reflow step is formed to have a width in the direction B, which is greater than the width in the direction B of the second conductor 361 described with reference to FIG. 9. The reason for this is that the surface 341g of the first conductor 341 and the surface 361g of the second conductor 361 are cut in a primary cutting step which is to be described later, so that the width in the direction B of the first conductor 341 and the width in the direction B of the second conductor 361 are made substantially equal.

Part (b) of FIG. 11 is a view illustrating a state after a primary mold step of the semiconductor device 161. The primary mold step is a step of sealing, with use of the first insulator 521, the first semiconductor element 381 and second semiconductor element 401, and covering the first conductor 341, second conductor 361, first convex conductor 441a, second convex conductor 441b, the proximal end portion of the first power terminal 461a, the proximal end portion of the second power terminal 461b, the connection member 481, and the proximal end portions of the signal terminals 501. The primary mold step is performed by, for example, transfer mold in which a first resin material is injected in a mold (not shown). The first resin material forms the first insulator 521. A gate position for injecting the first resin material is disposed near the surface 341b of the first conductor 341 or near the surface 361b of the second conductor 361. The primary mold step can be performed by an existing mold apparatus. The mold temperature is, for example, 180° C., and the forming pressure is, for example, about 15 MPa. By the primary mold step, the first insulator 521 covers the entire surfaces of the first conductor 341 and the entire surfaces of the second conductor 361.

Part (c) of FIG. 11 is a view illustrating a state after a primary cutting step of the semiconductor device 161. The primary cutting step is a step of forming on the first conductor 341 the first radiation surface 341c which is opposed to the second coupling surface 361a and is exposed from the first insulator 521, and forming on the second conductor 361 the second radiation surface 361c which is opposed to the second coupling surface 361a and is exposed from the first insulator 521, by cutting parts of the first insulator 521, first conductor 341 and second conductor 361. Incidentally, aside from the cutting process, grinding, polishing or cutting-off may be performed. Thus, the cutting process in the present specification may also be referred to as removal machining, which is a general term of such processes.

The primary cutting step is performed, along the direction B, from the outer surface of the first insulator 521 in the vicinity of the surface 341g. Similarly, the primary cutting step is performed, along the direction B, also from the outer surface of the first insulator 521 in the vicinity of the surface 361g.

By the primary cutting step, the first insulator 521 covering the surface 341g is cut. After the surface 341g is exposed, if the first conductor 341 is further cut in the direction B from the surface 341g side, the first radiation surface 341c, which is parallel to the first coupling surface 341a and is exposed from the first conductor 341, is formed on the first conductor 341. Incidentally, with the cutting of the first conductor 341, parts of the first insulator 521 covering the surface 341b, surface 341d, surface 341e and surface 341f of the first conductor 341 are also cut. Similarly, by the primary cutting step, the first insulator 521 covering the surface 361g is cut. After the surface 361g is exposed, if the second conductor 361 is further cut in the direction B from the surface 361g side, the second radiation surface 361c, which is parallel to the second coupling surface 361a and is exposed from the second conductor 361, is formed on the second conductor 361. Incidentally, with the cutting of the second conductor 361, parts of the first insulator 521 covering the surface 361b, surface 361d, surface 361e and surface 361f of the second conductor 361 are also cut. Incidentally, depending on the amount of cutting by the primary cutting step, there is a case in which the surface 341g corresponds to the first radiation surface 341c, and the surface 361g corresponds to the second radiation surface 361c. The primary cutting step is performed by, for example, a milling process using a diamond chip.

Part (d) of FIG. 11 is a view illustrating a state after a secondary mold step of the semiconductor device 161. The secondary mold step is a step of covering the first radiation surface 341c by the second insulator 621 and covering the second radiation surface 361c by the third insulator 622. The secondary mold step is performed by, for example, transfer mold in which a second resin material for forming the second insulator 621 and third insulator 622 is injected in a mold (not shown). A gate position for injecting the second resin material is disposed at a position opposed to the first radiation surface 341c and at a position opposed to the second radiation surface 361c. The mold temperature is, for example, 180° C., and the forming pressure is, for example, about 15 MPa. By the secondary mold step, the second insulator 621 is formed so as to cover the first radiation surface 341c and the third insulator 622 is formed so as to cover the second radiation surface 361c.

The second insulator 621 includes a planar first surface 621a which covers the first radiation surface 341c. In addition, the second insulator 621 includes a surface opposed to the first surface 621a. On this surface, in some cases, a gate trace, a parting line, and a stepped part of a parting portion are formed due to the secondary mold step. The surface that is opposed to the first surface 621a needs to be formed of a planar surface from which a gate trace, etc. have been cut, since this surface comes in contact with the planar heat-receiving surface of the radiator, as described above. The surface opposed to the first surface 621a is machined to be a planar surface, which is parallel to the first radiation surface 341c, by a secondary cutting step which will be described later. Thus, in the secondary mold step, the second insulator 621 is formed on the semiconductor device 161 so as to have a greater thickness than a preset predetermined thickness in direction B, so that the second insulator 621 has this preset predetermined thickness after a secondary cutting step which is to be described later.

The third insulator 622 includes a planar first surface 622a which covers the second radiation surface 361c. In addition, the third insulator 622 includes a surface opposed to the first surface 622a. On this surface, in some cases, a gate trace, a parting line, and a stepped part of a parting portion are formed due to the secondary mold step. The surface that is opposed to the first surface 622a needs to be formed of a planar surface from which a gate trace, etc. have been cut, since this surface comes in contact with the planar heat-receiving surface of the radiator, as described above. The surface opposed to the first surface 622a is machined to be a planar surface, which is parallel to the second radiation surface 361c, by the secondary cutting step which will be described later. Thus, in the secondary mold step, the third insulator 622 is formed on the semiconductor device 161 so as to have a greater thickness than a preset predetermined thickness in direction B, so that the third insulator 622 has this preset predetermined thickness after the secondary cutting step which is to be described later.

Part (e) of FIG. 11 is a view illustrating a state after a secondary cutting step of the semiconductor device 161. The secondary cutting step is a step of forming on the second insulator 621 the second surface 621b which is opposed to the first surface 621a covering the first radiation surface 341c and is parallel to the first radiation surface 341c, within such a range that the first radiation surface 341c of the first conductor 341 is not exposed. The second insulator 621 is cut along the direction B from the surface, which is opposed to the first surface 621a, toward the first surface 621a. The second insulator 621 is cut until having a preset predetermined thickness in the direction B, within such a range that the first radiation surface 341c of the first conductor 341 is not exposed.

Similarly, the secondary cutting step is a step of forming on the third insulator 622 the second surface 622b which is opposed to the first surface 622a covering the second radiation surface 361c and is parallel to the second radiation surface 361c, within such a range that the second radiation surface 361c of the second conductor 361 is not exposed. The third insulator 622 is cut along the direction B from the surface, which is opposed to the first surface 622a, toward the first surface 622a. The third insulator 622 is cut until having a preset predetermined thickness in the direction B, within such a range that the second radiation surface 361c of the second conductor 361 is not exposed.

After the secondary cutting step, the second surface 621b, which is opposed to the first surface 621a and is parallel to the first radiation surface 341c, is formed on the second insulator 621. The second insulator 621 is formed with a preset predetermined uniform thickness in the direction B. A gate trace, a parting line, and a stepped part of a parting portion, which have been formed on the second insulator 621 in the primary mold step, are removed from the second insulator 621 by the secondary cutting step. Similarly, after the secondary cutting step, the second surface 622b, which is opposed to the first surface 622a and is parallel to the second radiation surface 361c, is formed on the third insulator 622. The third insulator 622 is formed with a preset predetermined uniform thickness in the direction B. A gate trace, a parting line, and a stepped part of a parting portion, which have been formed on the third insulator 622 in the primary mold step, are removed from the third insulator 622 by the secondary cutting step.

The secondary cutting step, like the primary cutting step, is performed by, for example, a milling process using a diamond chip. The precision in the secondary cutting step is determined by only the mechanical machining precision.

According to the manufacturing method of the semiconductor device 161 of this embodiment, by simply using existing devices such as a mold device and a cutting device, it is possible to machine with high precision the second insulator 621 and third insulator 622 attached to the semiconductor device 161 such that the thickness of each of the second insulator 621 and third insulator 622 in the direction B becomes the preset predetermined thickness. Furthermore, the second surface 621b of the second insulator 621 can be machined with high precision so as to become parallel to the first radiation surface 341c, and the second surface 622b of the third insulator 622 can be machined with high precision so as to become parallel to the second radiation surface 361c.

By the above, it is possible to manufacture the semiconductor device 161 which can easily be fixed on the heat-receiving surface of the radiator without deteriorating heat radiation properties.

The fabrication steps of the manufacturing method of the above-described semiconductor device 161 are performed as described below. The above-described reflow step is a step of electrically connecting the first electrode 381a, which is included in the first semiconductor element 381, to the first coupling surface 341a which is included in the first conductor 341, and electrically connecting the second electrode 381b, which is included in the first semiconductor element 381 and formed on the surface thereof opposed to the first electrode 381a, to the second coupling surface 361a which is included in the second conductor 361. The same applies to the second semiconductor element 401.

The above-described primary mold step is a step of forming the first insulator 521 by sealing the first semiconductor element 381 and second semiconductor element 401 with a first insulative material.

The above-described primary cutting step is a step of forming the first radiation surface 341c on the first conductor 341 and forming the second radiation surface 361c on the second conductor 361 by removing a part of the first insulator 521, a part of the first conductor 341 and a part of the second conductor 361.

The above-described second mold step is a step of forming the second envelope portion including the second insulator 621 and third insulator 622 with a second insulative material having a higher coefficient of thermal conductivity than the first insulative material, such that the second envelope portion is in contact with the first radiation surface 341c and second radiation surface 361c.

The above-described secondary cutting step is a step of forming on the second envelope portion a surface which is parallel to the first radiation surface 341c by removing a part of the second envelope portion.

Additionally, the secondary cutting step is also a step of forming on the second envelope portion a surface which is parallel to the second radiation surface 361c by removing a part of the second envelope portion.

Additionally, in the primary cutting step, the step of forming the first radiation surface 341c on the first conductor 341 is a step of forming on the first conductor 341 the first radiation surface 341c which is opposed to the first coupling surface 341a. In the primary cutting step, the step of forming the second radiation surface 361c on the second conductor 361 is a step of forming on the second conductor 361 the second radiation surface 361c which is opposed to the second coupling surface 361a.

Incidentally, in the above-described embodiment, the description has been given of the example of the semiconductor device 161 in which the first coupling surface 341a and second coupling surface 361a (the first semiconductor element 381 and second semiconductor element 401 which are coupled to the first coupling surface 341a and second coupling surface 361a) are horizontal to the heat-receiving surface of the radiator. However, the angle to the heat-receiving surface may be an angle other than the horizontal angle, and is not specifically limited.

The present invention is not limited directly to the above-described embodiments. In practice, the structural elements can be modified and embodied without departing from the spirit of the invention. Various inventions can be made by properly combining the structural elements disclosed in the embodiments. For example, some structural elements may be omitted from all the structural elements disclosed in the embodiments. Furthermore, structural elements in different embodiments may properly be combined.

For example, the dimensions, shapes, etc. of the structural members of the semiconductor device and power converter are not limited to the above-described embodiments, and can be variously altered according to design.

The components of any embodiment described above can be combined with those of any other embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    step of electrically connecting a first electrode which is included in a semiconductor element, to a first coupling surface which is included in a first conductor, and electrically connecting a second electrode which is included in the semiconductor element and formed on a surface opposed to the first electrode, to a second coupling surface which is included in a second conductor;
    step of forming a first envelope portion by sealing the semiconductor element with a first insulative material;
    step of forming a first radiation surface on the first conductor and forming a second radiation surface on the second conductor by removing a part of the first envelope portion, a part of the first conductor and a part of the second conductor;
    step of forming a second envelope portion with a second insulative material having a higher coefficient of thermal conductivity than the first insulative material, such that the second envelope portion is in contact with the first radiation surface and the second radiation surface; and
    step of forming on the second envelope portion a surface which is parallel to the first radiation surface by removing a part of the second envelope portion.

2. The method of claim 1, wherein the step of forming the second radiation surface on the second conductor includes step of forming the second radiation surface on an imaginary plane including the first radiation surface, and
    the step of forming on the second envelope portion the surface which is parallel to the first radiation surface includes step of forming on the second envelope portion a surface which is opposed to a surface including the first radiation surface and the second radiation surface.

3. The method of claim 1, further comprising step of forming on the second envelope portion a surface which is parallel to the second radiation surface by removing a part of the second envelope portion,
    wherein the step of forming the first radiation surface on the first conductor includes step of forming on the first conductor the first radiation surface which is opposed to the first coupling surface, and
    the step of forming the second radiation surface on the second conductor includes step of forming on the second conductor the second radiation surface which is opposed to the second coupling surface.

* * * * *